(12) United States Patent
Shum et al.

(10) Patent No.: US 8,026,524 B2
(45) Date of Patent: Sep. 27, 2011

(54) LEDS WITH LOW OPTICAL LOSS ELECTRODE STRUCTURES

(75) Inventors: Frank T. Shum, Sunnyvale, CA (US);
William W. So, Sunnyvale, CA (US);
Steven D. Lester, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/888,360

(22) Filed: Sep. 22, 2010

(65) Prior Publication Data
US 2011/0006332 A1    Jan. 13, 2011

Related U.S. Application Data

(60) Continuation of application No. 12/493,499, filed on Jun. 29, 2009, which is a division of application No. 11/437,570, filed on May 19, 2006, now Pat. No. 7,573,074.

(51) Int. Cl.
*H01L 27/15* (2006.01)
*H01L 29/74* (2006.01)

(52) U.S. Cl. ............... 257/79; 257/80; 257/82; 257/83; 257/84; 257/88; 257/96; 257/99; 257/103; 257/E21.158; 257/E27.121; 257/E33.005; 257/E33.068

(58) Field of Classification Search .......... 257/79, 257/80, 82, 83, 84, 88, 98, 99, 103, E21.158, 257/E27.121, E33.005, E33.069; 438/25, 438/29, 39, 42, 46; 372/38.09, 43.01, 50.124
See application file for complete search history.

(56) References Cited

U.S. PATENT DOCUMENTS

| | | |
|---|---|---|
| 5,103,288 A | 4/1992 | Sakamoto et al. |
| 5,399,885 A | 3/1995 | Thijs et al. |
| 5,523,590 A | 6/1996 | Ogihara |
| 5,552,667 A | 9/1996 | Cho |
| 5,726,805 A | 3/1998 | Kaushik et al. |
| 6,121,636 A | 9/2000 | Morita et al. |
| 6,211,537 B1 | 4/2001 | Shimizu |
| 6,255,129 B1 | 7/2001 | Lin |
| 6,294,018 B1 | 9/2001 | Hamm et al. |
| 6,335,215 B1 | 1/2002 | Yuang |
| 6,404,792 B1 | 6/2002 | Yamamoto |

(Continued)

FOREIGN PATENT DOCUMENTS

JP    2001-176823 A    6/2001

(Continued)

OTHER PUBLICATIONS http://www.filmetrics.com/refractive-index-database.*

(Continued)

*Primary Examiner* — Dao H Nguyen
(74) *Attorney, Agent, or Firm* — Michael S. Garrabrants; Novak Druce + Quigg LLP

(57) ABSTRACT

Semiconductor devices in which one or more LEDs are formed include a dielectric region formed on a n/p region of the semiconductor, and that a metallic electrode can be formed on (at least partially on) the region of dielectric material. A transparent layer of a material such as Indium Tin Oxide can be used to make ohmic contact between the semiconductor and the metallic electrode, as the metallic electrode is separated from physical contact with the semiconductor by one or more of the dielectric material and the transparent ohmic contact layer (e.g., ITO layer). The dielectric material can enhance total internal reflection of light and reduce an amount of light that is absorbed by the metallic electrode.

14 Claims, 27 Drawing Sheets

U.S. PATENT DOCUMENTS

| | | |
|---|---|---|
| 6,440,570 B2 | 8/2002 | Huang |
| 6,451,712 B1 | 9/2002 | Dalton et al. |
| 6,455,340 B1 | 9/2002 | Chua |
| 6,529,541 B1 | 3/2003 | Ueki et al. |
| 6,614,055 B1* | 9/2003 | Kusuda et al. ............ 257/79 |
| 6,621,223 B1 | 9/2003 | Hen |
| 6,699,719 B2 | 3/2004 | Miki et al. |
| 6,728,281 B1 | 4/2004 | Santori |
| 6,784,462 B2 | 8/2004 | Schubert |
| 6,816,527 B2 | 11/2004 | Ueki |
| 6,905,618 B2 | 6/2005 | Matthews et al. |
| 6,919,583 B2* | 7/2005 | Tagami et al. ............ 257/79 |
| 6,960,779 B2* | 11/2005 | Shields et al. ............ 257/13 |
| 7,012,752 B2 | 3/2006 | Choi et al. |
| 7,075,962 B2 | 7/2006 | Ryou et al. |
| 7,078,257 B2* | 7/2006 | Sakamoto et al. ........ 438/46 |
| 7,116,691 B2 | 10/2006 | Ando |
| 7,129,512 B2 | 10/2006 | Shigihara |
| 7,141,825 B2 | 11/2006 | Horio et al. |
| 7,151,284 B2 | 12/2006 | Gwo |
| 7,173,293 B2 | 2/2007 | Taylor et al. |
| 7,268,485 B2 | 9/2007 | Tyan |
| 7,301,274 B2 | 11/2007 | Tanaka |
| 7,307,291 B2 | 12/2007 | Wu |
| 7,321,196 B2 | 1/2008 | Cheng |
| 7,405,431 B2 | 7/2008 | Aoyagi et al. |
| 7,462,861 B2 | 12/2008 | Slater, Jr. et al. |
| 7,573,074 B2 | 8/2009 | Shum |
| 7,737,455 B2 | 6/2010 | Shum |
| 2001/0015443 A1 | 8/2001 | Komoto |
| 2001/0042866 A1 | 11/2001 | Coman et al. |
| 2005/0056855 A1 | 3/2005 | Lin et al. |
| 2006/0072640 A1 | 4/2006 | Johnson et al. |
| 2007/0012930 A1* | 1/2007 | Liu et al. ............ 257/80 |
| 2007/0085100 A1 | 4/2007 | Diana et al. |
| 2009/0261373 A1 | 10/2009 | Shum |
| 2010/0133575 A1 | 6/2010 | Shum |
| 2010/0163911 A1 | 7/2010 | Shum |

FOREIGN PATENT DOCUMENTS

| | | |
|---|---|---|
| JP | 2003-224297 A | 8/2003 |
| JP | 2005-197289 A | 7/2005 |
| WO | WO2007/136391 A1 | 11/2007 |
| WO | WO2007/136392 A1 | 11/2007 |

OTHER PUBLICATIONS

"reflection (physics)" Wikipedia, the free encyclopedia, Aug. 26, 2004, downloaded from <http://web.archive.org/web/20040826062438/http://en.wikipedia.org/wiki/Reflection_(physics).

"Thin-film interference" Basic Physical Optics (E-III-3). May 9, 2003, downloaded from <http://web.archive.org/web/20030509188314/http://cord.org/step_online/stl4eiii3.htm>.

* cited by examiner

| 46 | Average of P&S Polarized |
|---|---|
| 47 | P Polarized |
| 48 | S Polarized |

| | |
|---|---|
| 83 | Average of P&S Polarized |
| 84 | P Polarized |
| 85 | S Polarized |

| 151 | Average of P&S Polarized |
| 152 | P Polarized |
| 153 | S Polarized |

| 161 | Average of P&S Polarized |
| --- | --- |
| 162 | P Polarized |
| 163 | S Polarized |

| 191 | Average of P&S Polarized |
| 192 | P Polarized |
| 193 | S Polarized |

| 1801 | NO SiO$_2$ |
| --- | --- |
| 1802 | $\frac{1}{16}\lambda$ SiO$_2$ |
| 1803 | $\frac{1}{4}\lambda$ SiO$_2$ |
| 1804 | $\frac{1}{2}\lambda$ SiO$_2$ |
| 1805 | $1\frac{3}{4}\lambda$ SiO$_2$ |

LEDS WITH LOW OPTICAL LOSS ELECTRODE STRUCTURES

CROSS-REFERENCE TO RELATED APPLICATIONS

This patent application is a continuation of U.S. patent application Ser. No. 12/493,499, filed on Jun. 29, 2009, which is a divisional of U.S. patent application Ser. No. 11/437,570, filed on May 19, 2006, now U.S. Pat. No. 7,573,074 both entitled LOW OPTICAL LOSS ELECTRODE STRUCTURES FOR LEDS; both of which are hereby expressly incorporated by reference in their entireties.

TECHNICAL FIELD

The present invention relates generally to light emitting diodes (LEDs). The present invention relates more particularly to electrode structures that mitigate optical losses and thus tend to enhance the brightness and/or the efficiency of LEDs.

BACKGROUND

Light emitting diodes (LEDs) for use as indicators are well known. LEDs have been used extensively for this purpose in consumer electronics. For example, red LEDs are commonly used to indicate that power has been applied to such devices as radios, televisions, video recorders (VCRs), and the like.

Although such contemporary LEDs have proven generally suitable for their intended purposes, they possess inherent deficiencies that detract from their overall effectiveness and desirability. For example, the light output of such contemporary LEDs is not as great as is sometimes desired. This limits the ability of contemporary LEDs to function in some applications, such as providing general illumination, e.g., ambient lighting. Even high power contemporary LEDs do not provide sufficient illumination for such purposes.

At least a part of this problem of insufficient brightness is due to inefficiency of contemporary LEDs. Efficiency of LEDs is a measure of the amount of light provided as compared to the electrical power consumed. Contemporary LEDs are not as efficient as they can be because some of the light generated thereby is lost due to internal absorption. Such internal absorption limits the amount of light that can be extracted from an LED and thus undesirably reduces the efficiency thereof.

Thus, although contemporary LEDs have proven generally suitable for their intended purposes, they possess inherent deficiencies which detract from their overall effectiveness and desirability. As such, it is desirable to provide LEDs that have enhanced brightness and/or efficiency.

BRIEF SUMMARY

Systems and methods are disclosed herein to provide brighter and/or more efficient LEDs. For example, in accordance with an embodiment of the present invention, an LED can comprise a reflective electrode structure comprising a metal electrode.

More particularly, the electrode can be formed upon a semiconductor material that emits light having a central wavelength $\lambda$. This light is emitted in all directions. A comparatively thick, optically transmissive dielectric material can be formed upon the semiconductor material. A portion of the electrode can be formed over the comparatively thick dielectric material. Another portion of the same electrode can be in electric contact with the semiconductor material. The electrode cooperates with the thick dielectric to enhance reflection such that light emitted in the direction of the electrode is reflected back into the semiconductor material and thus has another opportunity to be extracted from the LED.

The term wavelength ($\lambda$), as used herein, refers to the wavelength of light inside of the material that the light is traveling within. Thus, if light within a semiconductor material is being referred to, for example, then the wavelength of this light is its wavelength within the semiconductor material.

The thick dielectric thickness can be greater than $\frac{1}{2}\lambda$, where $\lambda$ is the Wavelength of light inside of the thick dielectric material. The thick dielectric material can have an index of refraction that is lower than that of the semiconductor material and that is greater than or equal 1.0 The light emitting semiconductor material can comprise AlGaAs, AlInGaP, AlInGaN, and/or GaAsP, for example. Other materials can similarly be suitable.

The optically transmissive thick dielectric layer can be a comparatively thick layer of material such as silicon dioxide, silicon monoxide, MgF2 and siloxane polymers, and/or air, for example. Other materials can similarly be suitable.

There can be an ohmic contact layer between the metal electrode and the semiconductor. The ohmic contact layer can comprise indium tin oxide (ITO), nickel oxide, and/or RuO2, for example. Other materials can similarly be suitable. The ohmic contact layer can be part of the semiconductor device comprising of a heavily doped layer.

There can be a current spreading layer between the metal electrode and the semiconductor. The current spreading layer is composed of indium tin oxide, nickel oxide, RuO2, for example. Other materials can similarly be suitable.

A series of one or more pairs of DBR dielectric layers can be formed between the thick dielectric layer and the metal electrode such that each DBR dielectric layer of this pair can be optically transmissive, of different indices of refraction from each other, and/or odd multiples of about $\frac{1}{4}\lambda$ thick.

Each layer of the pairs of DBR dielectric material can comprise titanium dioxide TiO2, Ti3O5, Ti2O3, TiO, ZrO2, TiO2ZrO2Nb2O5, CeO2, ZnS, Al2O3, SiN niobium pentoxide (Nb2O5), tantalum pentoxide (Ta2O5), siloxane polymers SiO, SiO2, and/or MgF2, for example. Other materials can similarly be suitable.

The metal electrode can be comprise one or more metal layers, wherein each metal layer can be selected from a group consisting of Al, Ag, Rh, Pd, Cu, Au, Cr, Ti, Pt nickel/gold alloys, chrome/gold alloys, silver/aluminum mixtures and combinations thereof. Other materials can similarly be suitable.

The LED can have either a vertical or lateral structure. A portion of the metal electrode can form an area for wire bonding. A portion of the metal electrode can make an electrical contact to the semiconductor material at the edges of the thick dielectric material. A portion of the metal electrode makes an electrical contact to the semiconductor material through openings in the thick dielectric material.

According to one embodiment of the present invention, a reflective electrode structure for an LED comprises a metal electrode. A GaN material emits light about some central wavelength $\lambda$. A comparatively thick silicon dioxide material can be formed upon the GaN material. A portion of the electrode can be formed over the thick dielectric material. Another portion of the same electrode can be in ohmic contact with a semiconductor material. The thick dielectric can have a thickness greater than $\frac{1}{2}\lambda$. Both the dielectric material and the metal electrode can make physical contact to the semiconductor via an ITO layer or other materials than can be similarly suitable.

According to one embodiment of the present invention, a reflective electrode structure comprises a metal electrode and a GaN material emits light about some central wavelength $\lambda$. A thick silicon dioxide material can be formed upon the GaN material. A series of at least one DBR pair can be formed upon the thick silicon dioxide material.

A portion of the electrode can be formed over both the thick dielectric material and the DBR pairs. Another portion of the same electrode can be in ohmic contact with the semiconductor material. The thick dielectric thickness can be greater than $\frac{1}{2}\lambda$.

Each layer of the DBR pairs can be optically transmissive, of different indices of refraction with respect to one another, and can be odd multiples of about $\frac{1}{4}\lambda$ in thickness. Both the thick dielectric and the metal electrode can make physical contact to the semiconductor via an ITO layer.

Thus, according to one or more embodiments of the present invention a brighter and/or more efficient LED can be provided. Increasing the brightness and/or efficiency of LED enhances their utility by making them more suitable for a wider range of uses, including general illumination.

This invention will be more fully understood in conjunction with the following detailed description taken together with the following drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Light emitting devices (LEDs) emit light in response to excitation by an electrical current. One typical LED has a heterostructure grown on a substrate by metal-organic vapor phase epitaxy or a similar technique. An LED heterostructure includes n-type and p-type semiconductor layers that sandwich a light producing layer, i.e., an active region. Exemplary active areas may be quantum wells surrounded by barrier layers. Typically, electrical contacts are attached to the n-type and p-type semiconductor layers. When a forward bias is applied across the electrical contacts electrons and holes flow from n-type and p-type layers to produce light in the active region. Light is produced according to well known principles when these electrons and holes recombine with each other in the active region.

The efficiency with which a LED converts electricity to light is determined by the product of the internal quantum efficiency, the light-extraction efficiency, and losses due to electrical resistance. The internal quantum efficiency is determined by the quality of the semiconductor layers and the energy band structure of the device. Both of these are determined during deposition of the semiconductor layers.

The light extraction efficiency is the ratio of the light that leaves the LED chip to the light that is generated within the active layers. The light extraction efficiency is determined by the geometry of the LED, self-absorption of light in semiconductor layers, light absorption by electrical contacts, and light absorption by materials in contact with the LED that are used to mount a device in a package.

Semiconductor layers tend to have relatively high indices of refraction. Consequently, most of the light that is generated in the active region of an LED is internally-reflected by surfaces of a chip many times before it escapes. To achieve high light-extraction efficiency it is important to minimize absorption of light by the semiconductor layers and by electrical connections to the chip. When these layers are made to have very low optical absorption, by being transparent or highly reflective, the overall light extraction in an LED is improved substantially.

Figure 1:
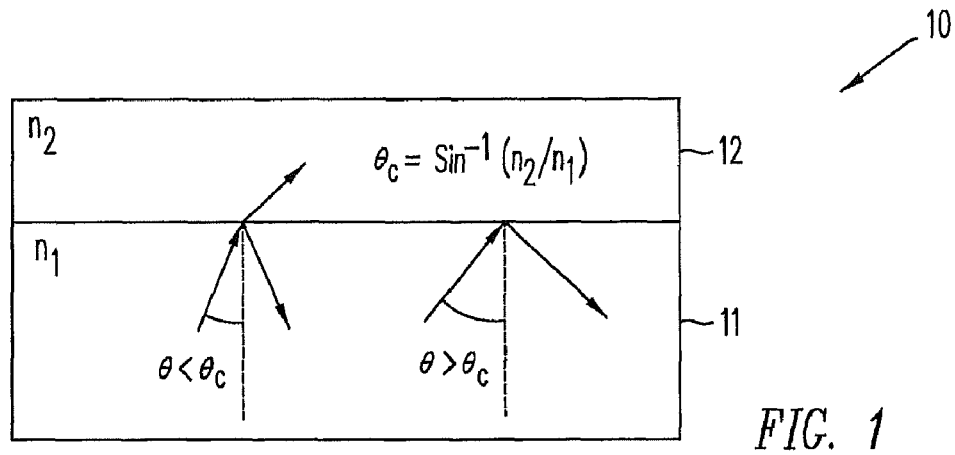
FIG. 1 is a schematic diagram showing the concept of critical angle.

Referring now to FIG. 1, light inside of a high index of refraction medium 11 is incident at interface to a lower index of refraction medium 12. The light can be incident at different angles. When light from a high index of refraction medium 11 encounters the interface to a lower index of refraction medium 12 the light can either be transmitted into the lower index of refraction medium 12 or be reflected back into the higher index of refraction medium 11.

According to Snell's law, a portion of the light traveling from a material having an index of refraction n1 into a material having a lower index of refraction n2 at an angle less than the critical angle Θc will pass into the lower index of refraction material. This is indicated by the arrow on the left that continues from the material having the lower index of refraction n1 into the material having the higher index of refraction n2.

Conversely, according to Snell's law, all of the light traveling from a material having a higher index of refraction n1 toward a material having a lower index of refraction n2 at an angle greater than the critical angle Θc will be reflected back into the higher index of refraction material. This mechanism is know is total internal reflection (TIR) and is indicated by the arrow on the right that does not continue from the material having the higher index of refraction n1 into the material having the lower index of refraction but the arrow rather extends back through the material having the higher index of refraction.

Light within a material having a higher index of refraction than exists outside of the material (such as light within a semiconductor material where air or an encapsulating epoxy is the outside material) which is incident upon the interface surface at angles greater than Θc will experience total internal reflection. Typical semiconductor materials have a high index of refraction compared to ambient air (which has an index of refraction of 1.0), or encapsulating epoxy (which can have an index of refraction of approximately 1.5).

In an LED, this light is reflected back into the LED chip where further absorption can undesirably occur from other materials. This undesirable absorption reduces the efficiency of the LED by reducing the amount of light that the LED provides.

For conventional LEDs, the vast majority of light generated within the structure suffers total internal reflection before escaping from a semiconductor chip. In the case of conventional Gallium Nitride (GaN) based LEDs on sapphire substrates, about 70% of emitted light can be trapped between the sapphire substrate and the outer surface of the GaN. This light is repeatedly reflected due to total internal reflection, thus suffering multiple absorptions by the metal electrodes and the other materials. It is thus desirable to create structures that tend to minimize this absorption.

As used herein, the term electrode can refer to a conductor (such as a metal conductor) that supplies current to a semiconductor material of an LED. Thus, an electrode can be in electrical contact with the semiconductor material. However, not all portions of an electrode are necessarily in contact with the semiconductor material. Indeed, according to one or more embodiments of the present invention, a portion of an electrode is in electrical contact with the semiconductor material and another portion of an electrode is not in electrical contact with the semiconductor.

Figure 2:
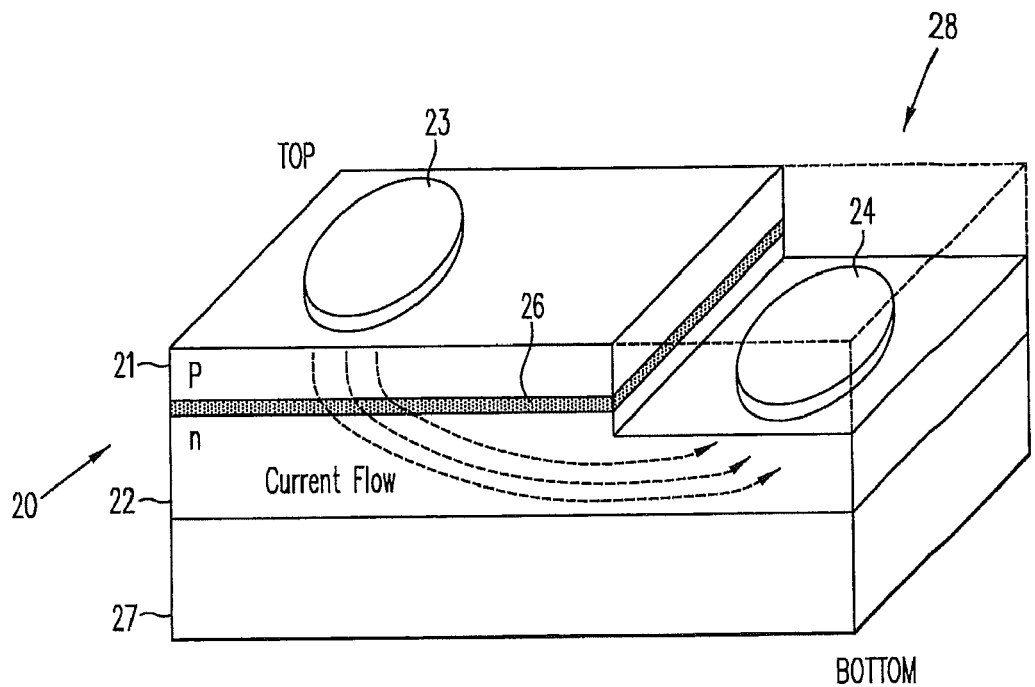
FIG. 2 is a semi-schematic perspective view of a contemporary lateral LED structure.

Referring now to FIG. 2, a contemporary lateral structure LED is shown. Regions on the surface of a p-layer 21 and an n-layer 22 of an LED 20 can be metallized so as to form electrodes 23 and 24. p-n junction or active region 26 is between p-layer 21 and an n-layer 22. Electrodes 23 and 24 provide a means to provide electrical power to LED 20. For device structures where the semiconductor is supported by an optically transparent, electrically non-conductive substrate 23, comprised of a material such as sapphire, the electrical contact to p-layer 21 and n-layer 22 must be made from the top surface.

In the configuration shown in FIG. 2, p-layer 21 is already exposed at top surface and electrical contact can be readily made therewith. However n-layer 22 is buried beneath both p-layer 21 and active region 26. To make electrical contact to n-layer 22, a cutout area 28 is formed by removing a portion of p-layer 21 and active layer 26 (the removed portion is indicated by the dashed lines) so as to expose n-layer 24 therebeneath. After the creation of cutout area 28, the n-layer electrical contact or electrode 24 can be formed.

Such device structures as that shown in FIG. 2 result in the current flowing generally in the lateral direction. This is why they are referred to as lateral structures. One disadvantage of such lateral structures is that a portion of the active light producing region must be removed to produce the cutout structure 28 so the n-electrode 24 can be formed. Of course, this reduces the active region area and consequently reduces the ability of LED 20 to produce light.

Figure 3:
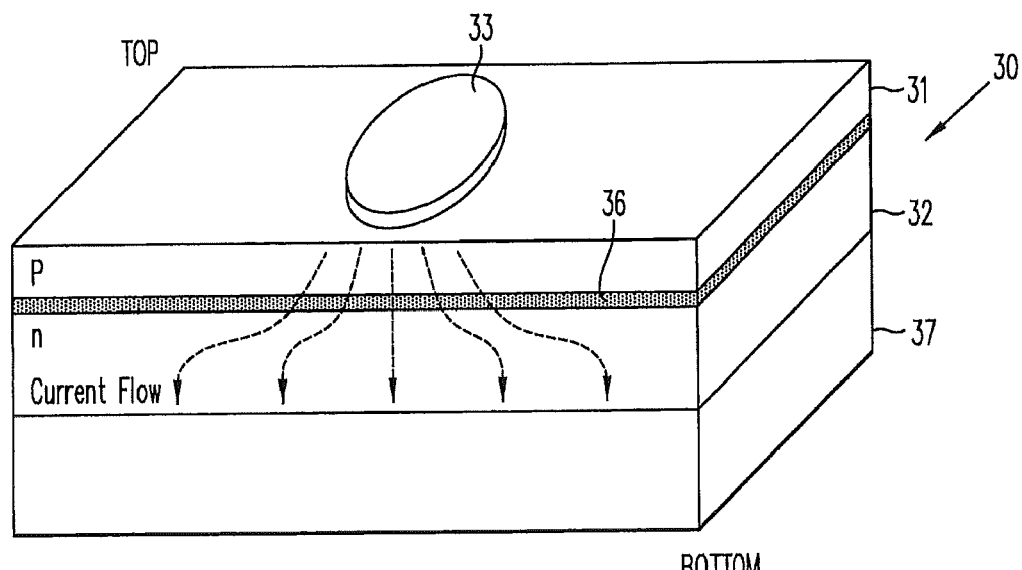
FIG. 3 is a semi-schematic perspective view of a contemporary vertical LED structure.

Referring now to FIG. 3, an LED 30 can alternatively comprise structures where the semiconductor (comprised of a p-layer 31 and an n-layer 32 that cooperate to define an active region 36) is supported by an electrically conductive substrate 37. Substrate 37 can be formed of an optically transparent conductive material such as silicon carbide or can be formed of an optically non-transparent, electrically conductive substrate such as copper or molybdenum. Such LEDs can be configured to have either the n-layer, or p-layer in contact with the substrate.

In such LEDs, electrically conductive substrate 37 serves as one electrode while the other electrode 33 can be readily formed on the top surface, e.g. p-layer 31. Since the contacts or electrodes are on opposing surfaces of LED 30, current flow is in a generally vertical direction. Such devices are thus referred to as vertical structures.

Regardless of whether the metal electrodes are for vertical or lateral LED structures, they must satisfy similar requirements. These requirements include good adhesion, the ability to make ohmic contact to the semiconductor, good electrical conductivity, and good reliability. Often, these requirements are satisfied by using two or more layers. For example a first layer of metal such as chromium or titanium can provide good adhesion and ohmic contact. A second layer of metal such as silver or gold can provide good electrical conductivity.

Although chromium has good adhesion and gold is a good electrical conductor. Neither material has good optical reflectivity in the visible region. The optical reflectivity and the corresponding optical absorption can be calculated from the refractive indices of these structures and their corresponding thicknesses.

Where a material thickness has not been given herein, the thickness can be assumed to be great enough such that optical interference effects are not an issue. For example, such reflectivity calculations typically assume the incident and exit medium to be semi-infinite. In cases of metal reflector layers where their thickness have not been specified, they are assumed to be thick enough, typically a few thousand nanometers, so that an insignificant amount of light reaches the other surface of the metal. The refractive index values of Table 1 are used to calculate all reflectivity curves in this disclosure.

TABLE 1

| Dielectric Material | Abbreviation | Wavelength (nm) | Refractive Index (Real) | Refractive Index (Imaginary) |
|---|---|---|---|---|
| Aluminum | Al | 450 | 0.49 | −4.7 |
| Titanium Dioxide | TiO2 | 450 | 2.57 | −0.0011 |
| Silicon Dioxide | SiO2 | 450 | 1.465 | 0 |
| Air | Air | 450 | 1 | 0 |
| Gold | Au | 450 | 1.4 | −1.88 |
| Chromium | Cr | 450 | 2.32 | −3.14 |
| Indium Tin Oxide | ITO | 450 | 2.116 | −0.0047 |
| Titanium | Ti | 450 | 2.27 | −3.04 |
| Silver | Ag | 450 | 0.132 | −2.72 |
| Gallium Nitride | GaN | 450 | 2.45 | |
| Nano Porous Silicon Dioxide | SiO2_Nano | 633 | 1.1 | 0 |
| Titanium Dioxide | TiO2 | 633 | 2.67 | 0 |
| Gallium Phosphide | GaP | 633 | 3.31 | 0 |
| Silicon Dioxide | SiO2 | 633 | 1.456 | 0 |

The thickness of materials as referenced in this disclosure can be in absolute units, TABS, such as microns (m) or nanometers (nm). Alternatively, the thickness of material can be given relative to the number of wavelengths in the medium, TIReI. When given as the number of wavelengths (λ), the parameter specifically refers to the wavelength of light within the material itself. This can be converted to the absolute thickness by multiplying by the index of refraction of the material (N) as indicated by Equation 1 below. For example a ¼λ of SiO2 at 450 nm would be 76.8 nm (0.25 450/1.465).

$$TABS = (T\,ReI/N) \cdot \lambda \qquad \text{(Equation 1)}$$

The optically reflectivity curve as a function of incident angle has two components, i.e., P-polarized light and S-polarized light. P-polarized light experiences Brewster's angles and has a lower overall reflectivity than S-polarized light.

Figure 4A:
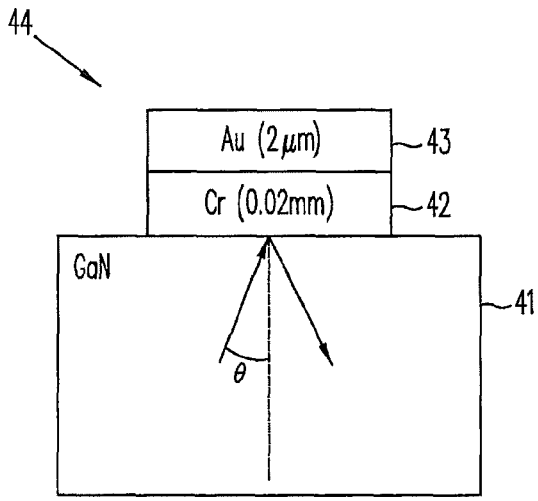
FIG. 4A is a semi-schematic diagram showing light reflection at a contemporary GaN/Cr/Au interface.

Referring now to FIG. 4A, a diagram of a contemporary semiconductor and electrode structure showing the reflectivity of an electrode 44 for light originating within the semiconductor 41 is provided. The electrode utilizes a typical chromium 42 and gold 43 electrode configuration and is formed upon a GaN semiconductor 41. For a reflection at an incident angle of 45 degrees, an average of only 25% of the P-polarized and S-polarized light is reflected while, 75% of the light is absorbed. Thus, this contemporary configuration is undesirably highly absorbing.

Although FIG. 4A shows a gold/chromium metal electrode structure formed upon GaN, other metals and semiconductor materials can alternatively be utilized.

Figure 4B:
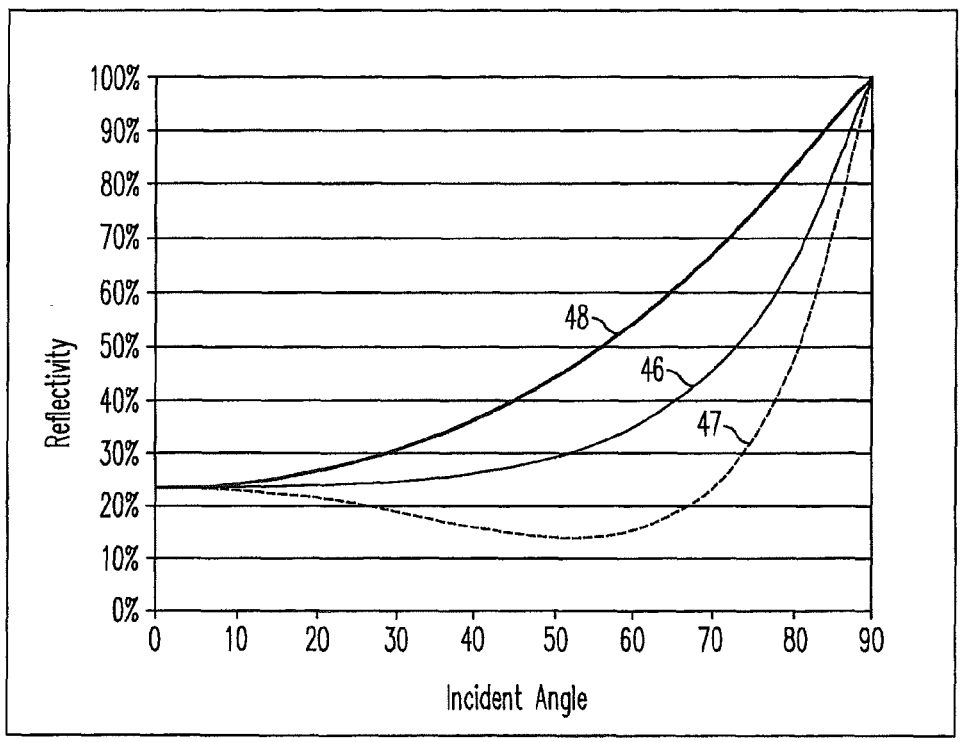
FIG. 4B is a chart showing reflectivity at the GaN/Cr/Au interface of FIG. 4A for different angles of incidence.

Referring now to FIG. 4B, a chart shows reflectivity at the GaN/Cr/Au interface of the device of FIG. 4A for different angles of incidence.

Figure 5A:
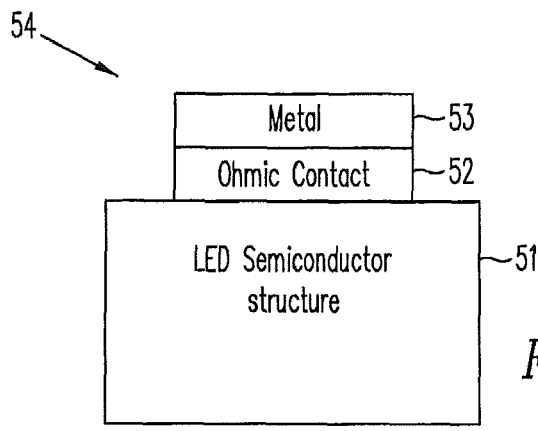
FIG. 5A is a semi-schematic diagram showing a contemporary electrode structure having an ohmic contact layer.

Referring now to FIG. 5A, a more generic contemporary contact structure is shown. According to this more generic contact structure, there may be an ohmic contact and/or current spreading layer 52 between a metal contact 53 and a semiconductor material 51. The metal contact 53 may have multiple layers for purposes for adhesion, diffusion barrier, solder, electrical conductivity, and ohmic contact. The layers can be fabricated from various metals and combinations of metals, including nickel, platinum, titanium, silver, aluminum, gold, tin, lead, and chromium. The semiconductor material 51 can be from the material systems such as AlGaAs, AlInGaP, AlInGaN, and GaAsP. The ohmic contact layer can be part of the metal electrode layers such as nickel oxide.

Figure 5B:
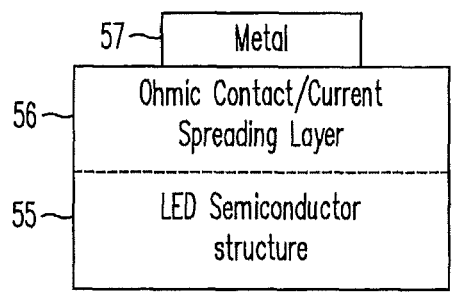
FIG. 5B is a semi-schematic diagram showing a contemporary electrode structure having an ohmic contact/current spreading layer.

Referring now to FIG. 5B, an electrically conductive metal oxide such as indium tin oxide or nickel oxide can be deposited on entire surface of semiconductor 55 to define an ohmic contact/current spreading layer 56 upon which metal electrode 57 can be formed. In such a case, layer 56 serves both as an ohmic contact and current spreading layer. There can be a layer that allows for ohmic contact on the very top of the LED semiconductor material, such as a heavily doped region.

Regardless of the exact metal electrode configuration, semiconductor material or LED structure, contemporary metal electrodes undesirably absorb some light. In additional, metal contacts are not transparent, they block the available surface area where light can escape. Thus, such contemporary electrodes have a double effect. They not only directly absorb a portion of the incident light, but the remaining reflected light is directed back into the device where it suffers further absorption by other materials. The total amount of absorption is highly dependent on the exact configuration of the electrode and tends to scale proportionally to the size of the electrode contact area.

Figure 6A:
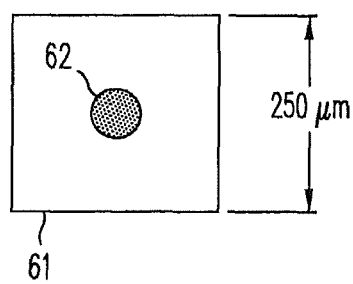
FIG. 6A is a semi-schematic top view of a portion of a contemporary LED die showing a circular contact that can also function as a bond pad.
Figure 6B:
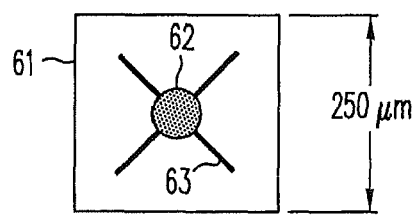
FIG. 6B is a semi-schematic top view of a portion of a contemporary LED dice showing a cross shaped contact with a circular bond pad.
Figure 6C:
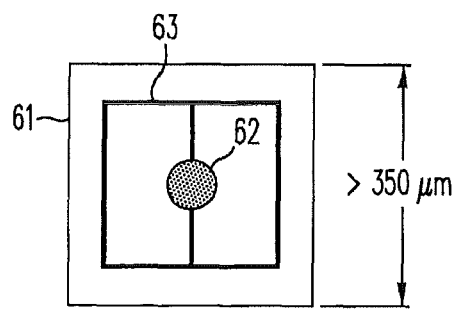
FIG. 6C is a semi-schematic top view of a portion of a contemporary LED dice showing exemplary contact geometry that is suitable for use with larger LEDs and having a circular contact that can also function as a bonding pad.

Referring now to FIGS. 6A-6C, the principle of current spreading so as to mitigate the problem of current crowding is discussed. The p-layer and n-layer of contemporary LEDs are thin and have relatively low electrical conductivity. By themselves, these layers do not evenly distribute current to all regions of the p-n junction, i.e., the active region. For larger areas where portions of the active region are far away from the electrode, there will be less current flow in these distant areas than in areas close to the metal contact. This results in uneven current distribution and consequent uneven light emission. To reduce current crowding, the geometry of the metal electrodes is extended over the semiconductor surface. These extensions however lead to additional undesirable light absorption.

With particular reference to FIG. 6A, a circular contact or electrode 62 can be formed upon a semiconductor 61 and can serve as a wire bond pad. With particular reference to FIG. 6B, a cross shaped contact 63 can be combined with electrode 62 to enhance current spreading. With particular reference to FIG. 6C, various other geometrical structures 63 can similarly be combined with electrode 62 to facilitate current spreading, especially on larger LED dies.

Typically, wire bonds are used as a means to provide electric power the LED. However the wire bond pad areas must be some minimum size of about 100 m by 100 m. Since the size of each wire bond pad is fixed regardless of device size, the absorbing and opaque wire bond areas can be a significant portion of the overall surface area and for same LED devices.

One method for reducing the undesirable absorption of light by an electrode is to minimize the contact area or the width of the electrode. If electrical connection to the LED semiconductor material is the only consideration, then the contact width can be quite narrow, such as on the order of a few microns. However, an important consideration is the undesirable increase of electrical resistivity caused by decreasing the cross sectional area. In high power applications, the electrode may carry an amp or more of current. This requires the cross sectional area, width (W)×thickness (T) to be of some minimum value to minimize electrical resistance. Thus, the contact area or width of the electrode cannot merely be reduced without otherwise compensating for the increase in resistivity of the electrode.

Figure 7A:
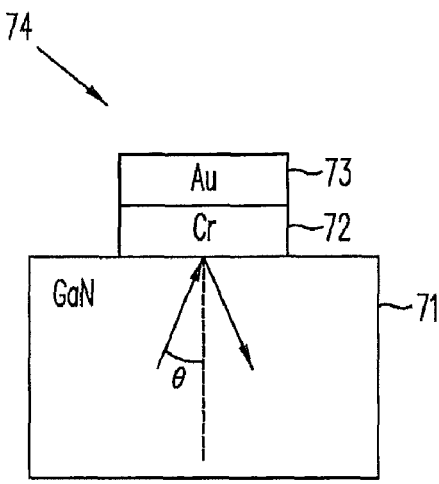
FIG. 7A is a semi-schematic side view of a contemporary low aspect ratio electrode structure.

Referring now to FIG. 7A, a typical dimension for a gold electrode is W=20 m and T=2 m for a total cross sectional area of 40 m2. Theoretically, one could keep a constant cross sectional area and therefore a constant electrical resistance by proportionally increasing thickness while decreasing the width as discussed with reference to FIG. 7B below.

Figure 7B:
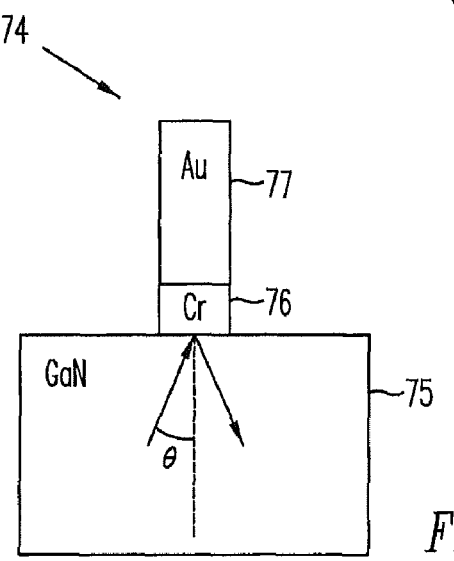
FIG. 7B is a semi-schematic side view of a high aspect ratio electrode structure.

Referring now to FIG. 7B, according to one embodiment of the present invention the aspect ratio of electrode 77 can be increased. That is, the height of electrode 77 can be increase as compared to the width thereof. For example, the height can be increase so as to provide a thickness greater than 2.5 m. In this manner, the area of electrode 74 that is in contact with semiconductor 75 (and is thus available for light absorption) is reduced and light absorption is consequently similarly reduced. Increasing the height of electrode 77 desirably maintains its conductivity. The contact area has been decreased and the thickness of the electrode has been increased so as to maintain desired conductivity. However manufacturing cost and practical process considerations typically limit electrode thickness to 2.5 m or below. Thus the electrode contact area and its associated absorption become much greater than would be necessary if the electrode was used for only electrical contact to the semiconductor material.

Another method for reducing electrode absorption is to increase the reflectivity of the electrode. Several prior art approaches have been used to create reflective electrodes for LEDs. The simplest is to use a metal that has a high reflectivity. These include Al, Ag, Re and others known to one familiar with the art.

The chosen metal needs to not only have a high reflectance, but must also make an acceptably low resistance ohmic contact to the semiconductor material. In the case of p-type AlInGaN, only Ag combines low electrical resistance with high reflectivity.

Figure 8A:
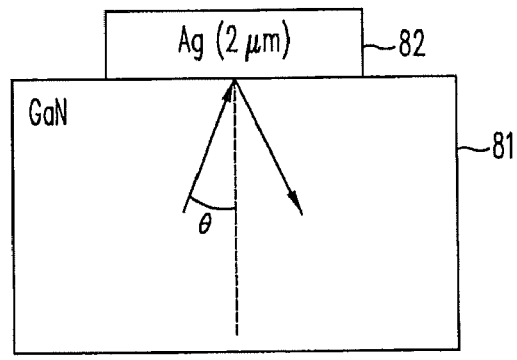
FIG. 8A is a semi-schematic diagram showing light reflection at a contemporary Ag interface.

Referring now to FIG. 8A, an electrode structure comprised of Ag is shown. That is, an Ag electrode 82 is formed upon a semiconductor substrate 81. Unfortunately, Ag presents a reliability concern because it is subject to tarnish and it is subject to electromigration during device operation. Also, the contact resistance of Ag-based contacts sometimes increases with time during device operation.

Figure 8B:
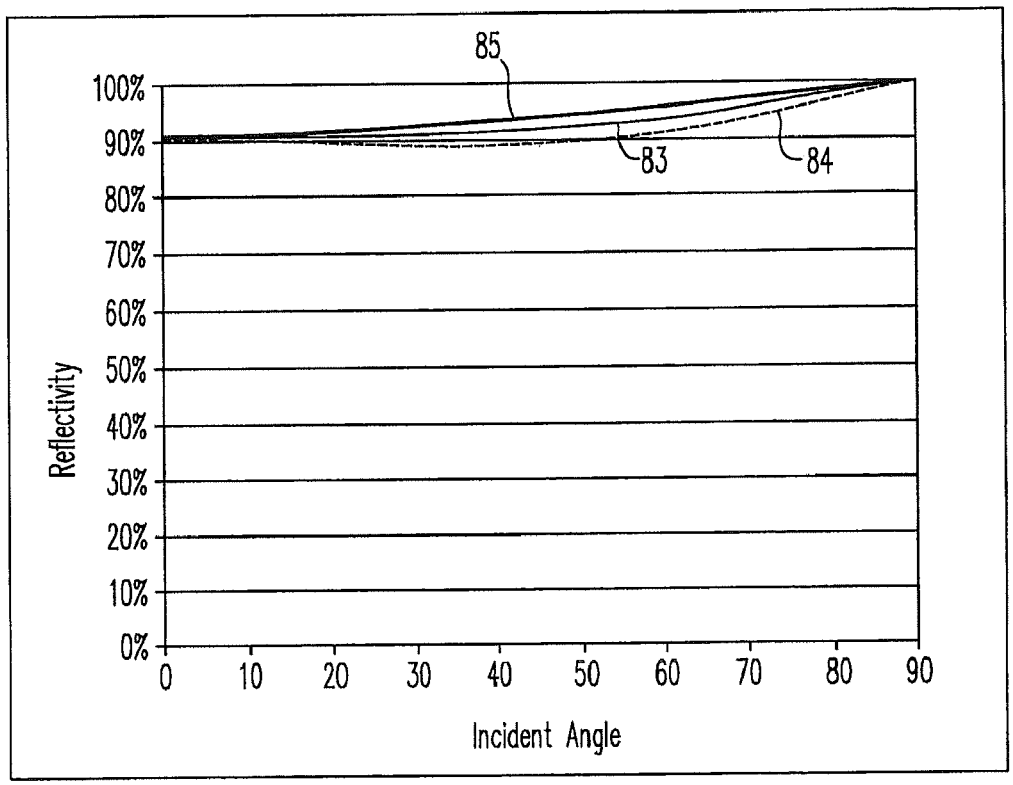
FIG. 8B is a chart showing reflectivity at the Ag interface of FIG. 8A for different angles of incidence.

Referring now to FIG. 8B, the reflectance of the Ag electrode of FIG. 8A for different angles of incidence is shown. Even with a highly reflective metal electrode, silver, the absorption per reflection near normal incidence is about 10%. It would be desirable to further decrease absorption to well below 10%.

Figure 9A:
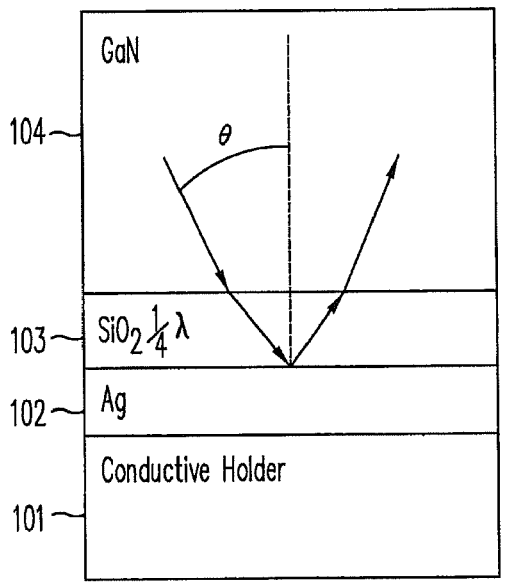
FIG. 9A is a semi-schematic diagram showing light reflection at a contemporary GaN/SiO2/Ag interface of a vertical structure LED.

Referring now to FIG. 9A, it is known to use a ¼λ layer of dielectric 103, i.e., SiO2, to enhance reflectivity in a vertical structure LED. The dielectric 103 is formed between a GaN semiconductor 104 and an Ag metal layer 102, both of which are formed upon a conductive holder 101. However, as discussed below, the use of a ¼λ of dielectric does not substantially enhance reflectivity.

Figure 9B:
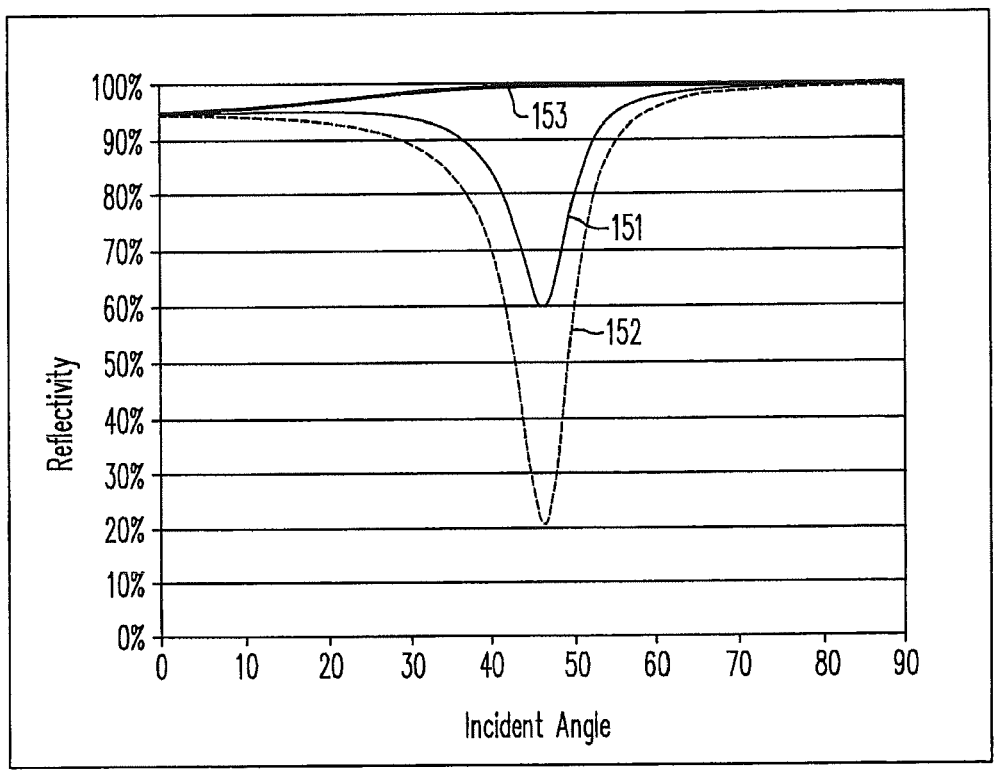
FIG. 9B is a chart showing reflectivity at the GaN/SiO2/Ag interface of FIG. 9A for different angles of incidence.

Referring now to FIG. 9B, it can be seen that the use of the ¼λ layer of dielectric does provide enhanced reflectance for the S polarized light incident thereon, as indicated by curve 153. However, the P polarized light incident upon this dielectric layer has a deep dip in the reflectance curve around 47°, as indicated by curve 152. This dip substantially reduces the overall reflectivity, as indicated by the curve 151 for the average of the S polarized and the P polarized light. Therefore, the use of a ¼λ layer of dielectric is not a suitable solution to the problem of light absorption by an LED electrode.

According to one embodiment of the present invention, a reflective electrode structure minimizes contact area between the electrode and the LED semiconductor material. A comparatively thick dielectric material is disposed between a conductive electrode and the semiconductor material so as to electrically isolate portions of the electrode while allowing for other portions to make electrical contact. The dielectric material can be of a lower index of refraction than the semiconductor and can be thick enough such that total internal reflection occurs for incident angles greater than the critical angle Θc, as discussed below.

Total internal reflection for dielectric materials provides the desirable capability for approximately 100% reflectivity. Total internal reflection occurs beyond the critical angle, Θc. In the case of a GaN to air interface, the critical angle is approximately 24°. In the case of a GaN to SiO2 interface, the critical angle is approximately 37°.

Figure 10A:
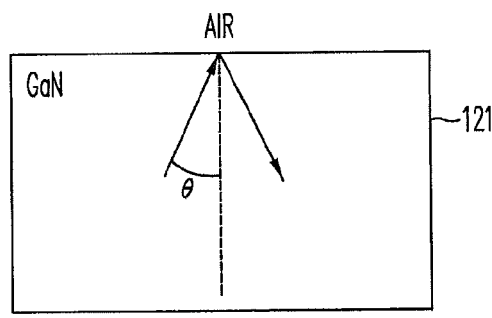
FIG. 10A is a semi-schematic diagram showing light reflection at a contemporary GaN/air interface.

Referring now to FIG. 10A, a semi-schematic diagram shows light reflection at a GaN/air. A ray of light is shown being reflected from the interface back into the GaN semiconductor material 121 because the angle of incidence is greater than the critical angle Θc.

Figure 10B:
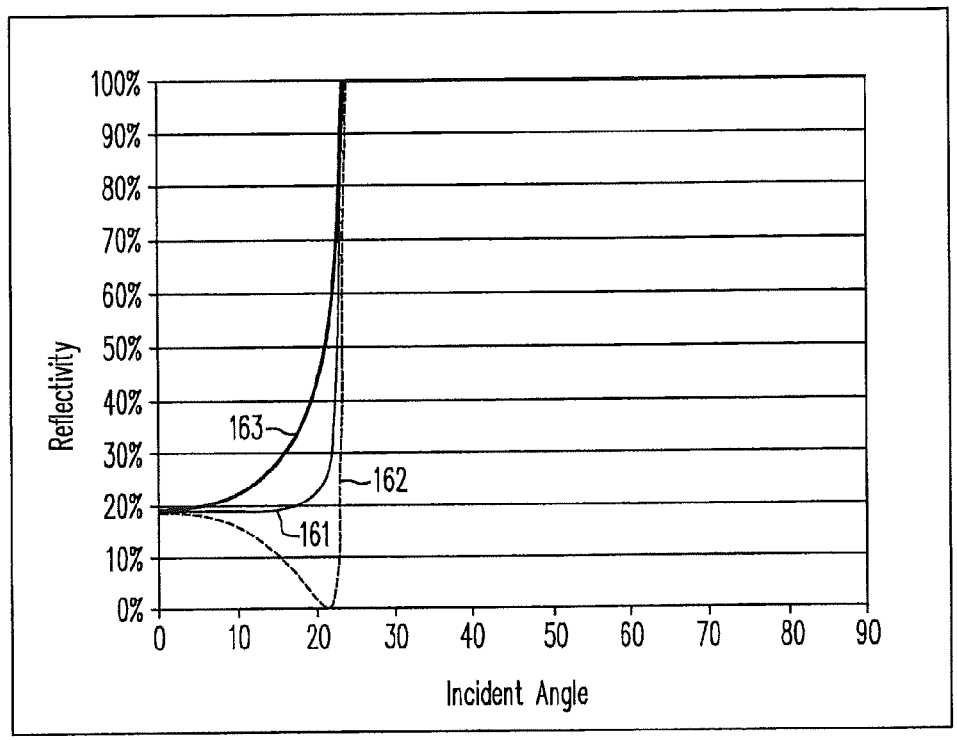
FIG. 10B is a chart showing reflectivity at the GaN/air interface of FIG. 10A for different angles of incidence.

Referring now to FIG. 10B, a chart shows reflectivity at the GaN/air interface of FIG. 10A for different angles of incidence.

Figure 11A:
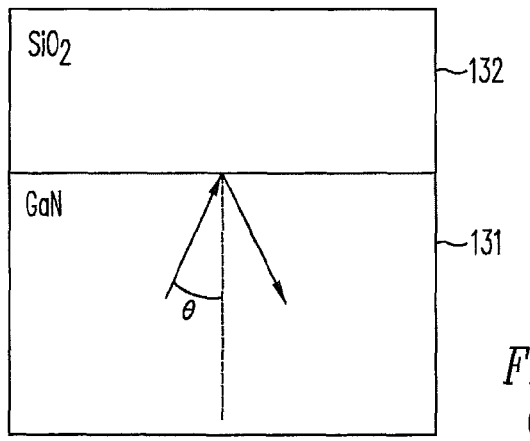
FIG. 11A is a semi-schematic diagram showing light reflection at a GaN/SiO2 interface, wherein the thick dielectric is thick according to an embodiment of the present invention.

Referring now to FIG. 11A, a semi-schematic diagram shows light reflection at a GaN/SiO2 interface according to an embodiment of the present invention. A ray of light is shown being reflected from the interface of the GaN semiconductor material 131 and the SiO2 layer 132 back into the GaN semiconductor material 131 because the angle of incidence is greater than the critical angle Θc.

Figure 11B:
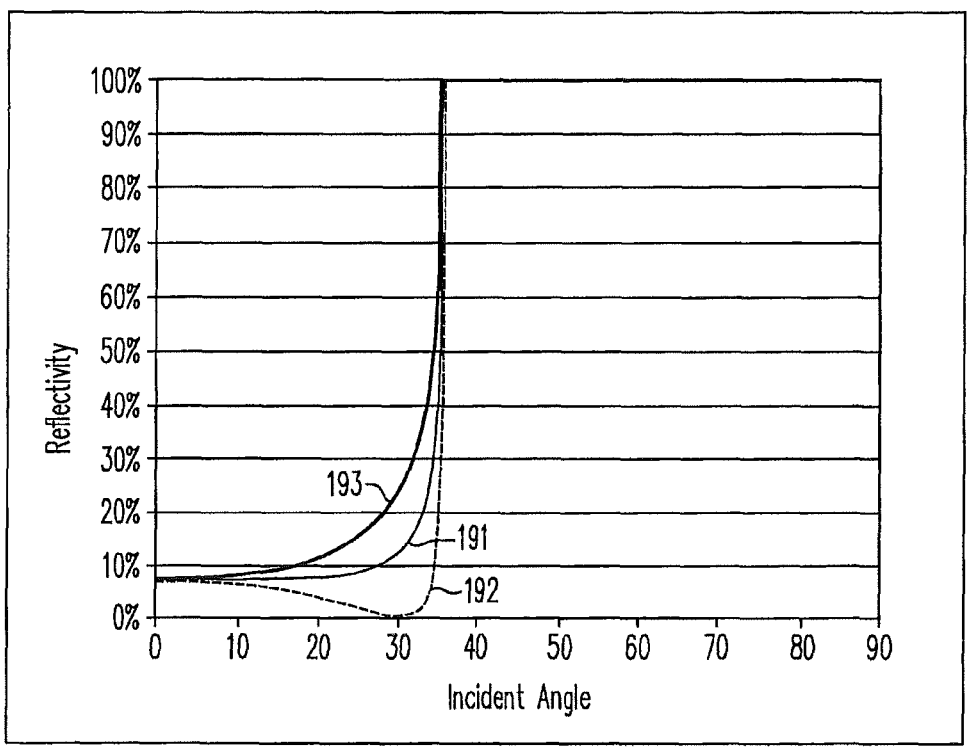
FIG. 11B is a chart showing reflectivity at the GaN/SiO2 interface of FIG. 11A for different angles of incidence.

Referring now to FIG. 11B, a chart shows reflectivity at the GaN/SiO2 interface of FIG. 11A for different angles of incidence according to an embodiment of the present invention.

Figure 12A:
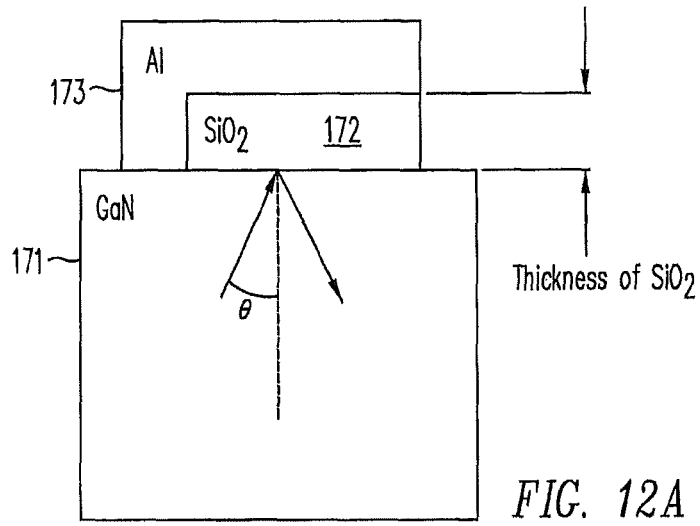
FIG. 12A is a semi-schematic diagram showing light reflection at a GaN/SiO2/Al interface according to an embodiment of the present invention.

Referring now to FIG. 12A, is a semi-schematic diagram show light reflection at a GaN/SiO2/Al interface according to an embodiment of the present invention. A portion of electrode 173 is suspended over GaN substrate 171 and has a thick dielectric SiO2 layer 172 formed therebetween. Another portion of electrode 173 is formed directly upon GaN substrate 171.

Figure 12B:
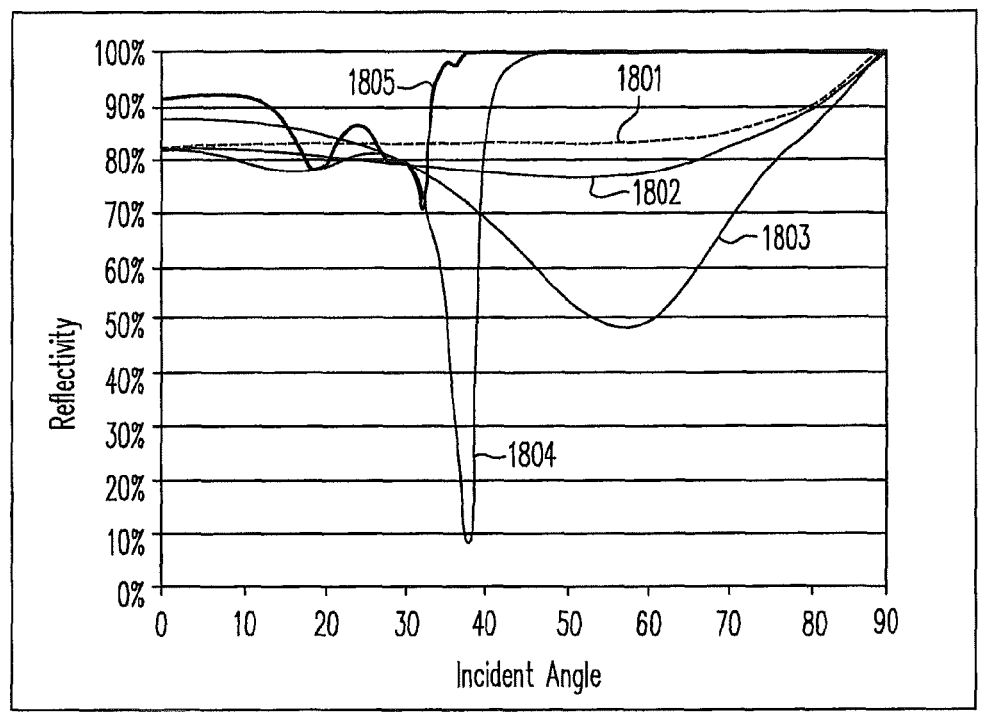
FIG. 12B is a chart showing reflectivity at the GaN/SiO2/Al interface of FIG. 12A for different angles of incidence wherein thicknesses of the SiO2 layer are less than or equal to 1¾ the wavelength of incident light according to an embodiment of the present invention.

Referring now to FIG. 12B, is a chart showing the P-polarization reflectivity at the GaN/SiO2/Al interface of FIG. 12A for different angles of incidence wherein thicknesses of the SiO2 layer are less than or equal to 1¾λ according to an embodiment of the present invention. At a 1/16λ of SiO2 there is no total internal reflection effect and the reflectivity is marginally worse than without the SiO2 layer. At a ¼λ of SiO2 there is still no TIR effect and the reflectivity is dramatically worse. At ½λ of SiO2 total internal reflection does occur for large incident angles but a tremendous dip in reflectivity occurs at approximately 38°. At 1¾λ, total internal reflection occurs for the high angles of incidence and no noticeable dip in reflectivity. Since TIR begins at ½λ of SiO2, the term "thick" dielectric will refer to all dielectrics thicker or equal to ½λ.

Figure 12C:
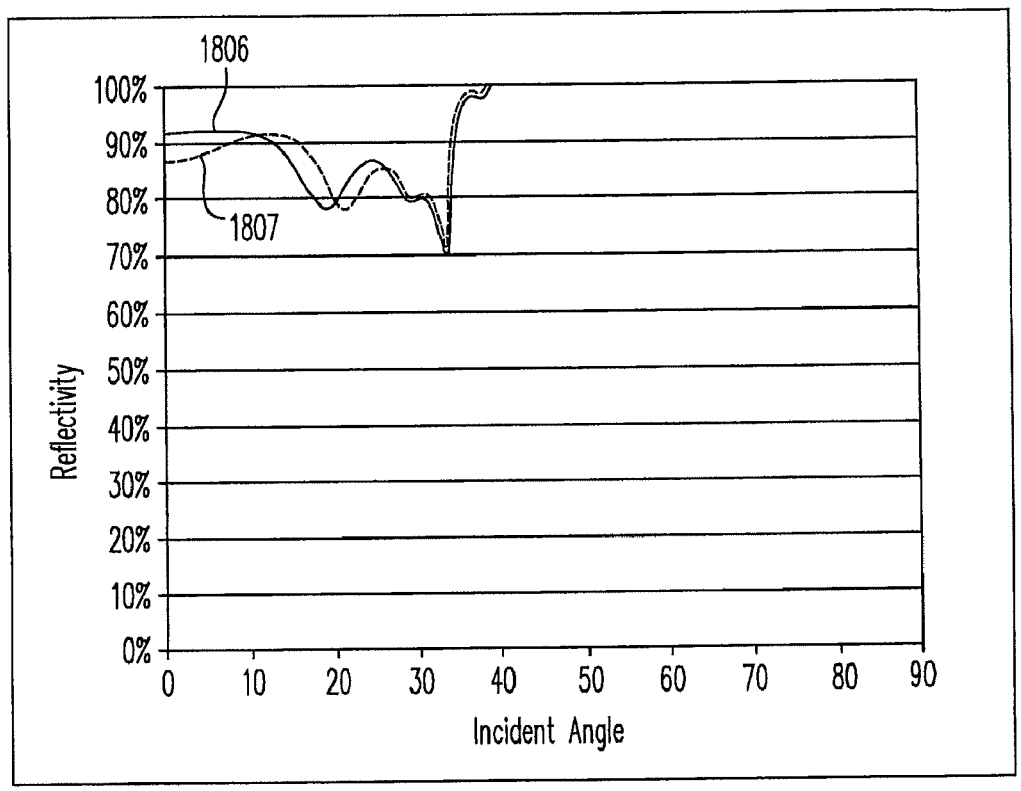
FIG. 12C is a chart showing reflectivity at the GaN/SiO2/Al interface of FIG. 12A for different angles of incidence wherein thicknesses of the SiO2 layer are greater than 1¾ the wavelength of incident light according to an embodiment of the present invention.

Referring now to FIG. 12C, is a chart showing reflectivity at the GaN/SiO2/Al interface of FIG. 12A for different angles of incidence wherein thicknesses of the SiO2 layer are greater than 1¾ the wavelength of incident light according to an embodiment of the present invention.

Once the dielectric layer is greater than this minimum thickness for total internal reflection, its exact thickness is not as critical as in conventional optical coatings based on interference. This allows for greater latitude in the manufacturing process. This is illustrated in FIG. 12C, which shows the reflectivity curves of for a thick dielectric at two different thicknesses, one at 1.75λ, and the other at 1.85λ. The total internal reflection angle does not change.

Figure 13A:
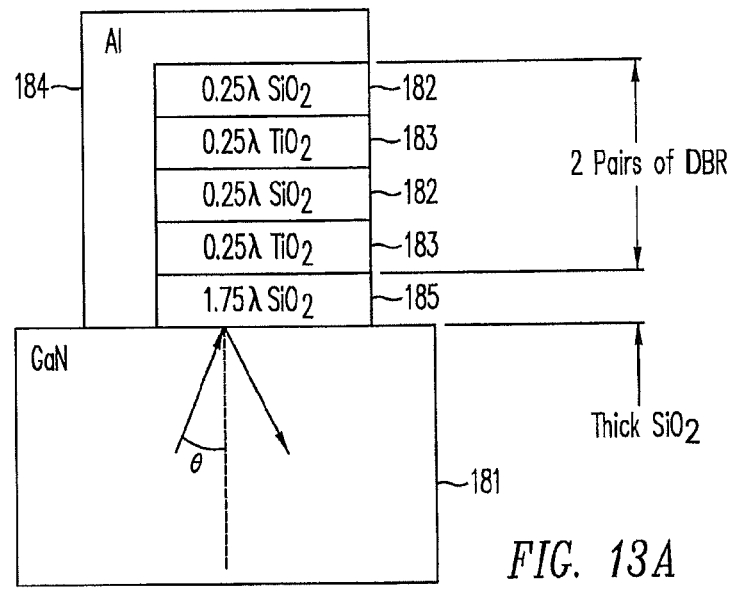
FIG. 13A is a semi-schematic diagram showing light reflection at a distributed Bragg reflector (DBR) comprised of alternating layers of SiO2 and TiO2 according to an embodiment of the present invention.

Referring now to FIG. 13A, a semi-schematic diagram shows light reflection at a distributed Bragg reflector (DBR) comprised of alternating layers of SiO2 182 and TiO2 183 on top of the thick dielectric SiO2 base layer 185 according to an embodiment of the present invention. An electrode 184 makes electrical contact to semiconductor material 181 and is the final layer onto top of the DBR stack. Thick dielectric layer 185 is formed between the DBR stack and semiconductor material 181.

The thick dielectric creates an effective reflector at high angles. However, it does not substantially enhance the reflectivity below the critical angle. It is possible to add a distributed Bragg reflector (DBR) to reflect the light at these lower angles. DBRs are typically fabricated using a series of alternating high index/low index dielectric materials. As shown in FIG. 13A, a series of 2 pairs of ¼λ SiO2 and ¼λ TiO2 over a thick layer of 1¾λ SiO2 enhances the reflectivity at lower angles. DBRs use optical interference to affect reflectivity, as result their thickness is more critical than the thickness of the underlying thick SiO2 layer.

Table 2 below provides further information regarding the electrode materials utilized according to one or more embodiments of the present invention. The reference wavelength for the coating thickness is 0.4500 microns. The phase and retardance values are in degrees. The coating has six layers. The incident media is GaN. The wavelength of the light used is 0.4500 microns.

TABLE 2

| Material | Thickness |
| --- | --- |
| Al1 | 1.000000 |
| SiO2 | 0.250000 |
| TiO2 | 0.250000 |
| SiO2 | 0.250000 |
| TiO2 | 0.250000 |
| SiO2 | 0.750000 |

Figure 13B:
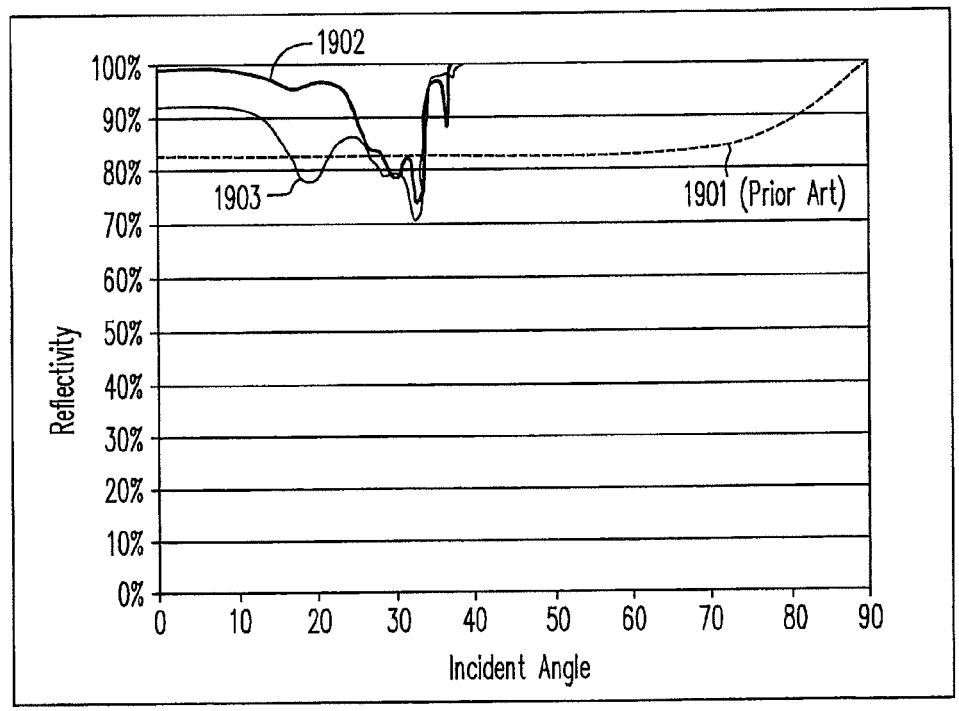
FIG. 13B is a chart showing reflectivity at the DBR layers of FIG. 13A for different angles of incidence according to an embodiment of the present invention.

Referring now to FIG. 13B, is a chart showing reflectivity at the DBR layers of FIG. 13A for different angles of incidence according to an embodiment of the present invention compared to a design with only thick dielectric compared to a design with no thick dielectric and no DBR.

Figure 14:
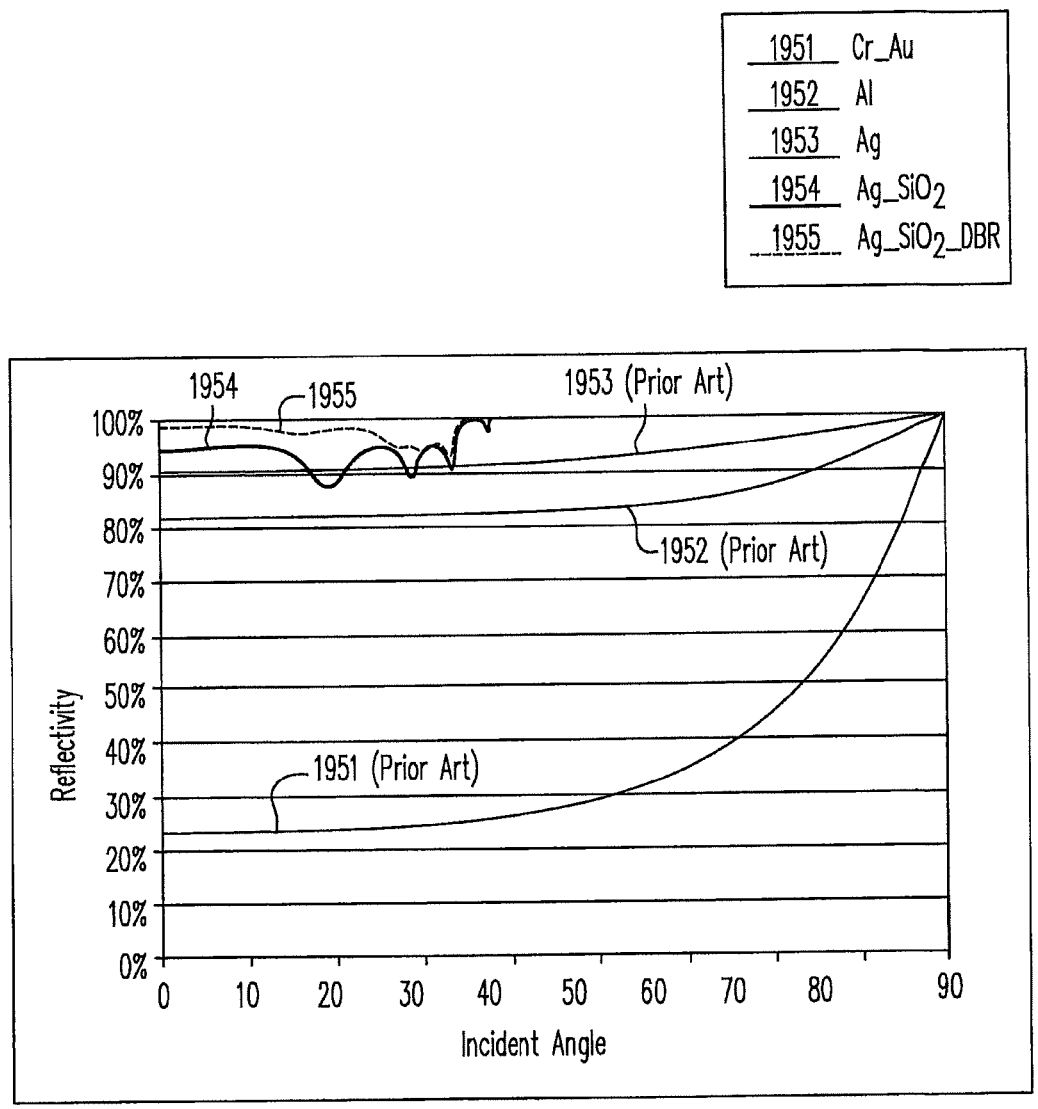
FIG. 14 is a chart showing reflectivity of several materials for different angles of incidence according to an embodiment of the present invention.

Referring now to FIG. 14, is a chart showing reflectivity of several materials for different angles of incidence according to an embodiment of the present invention as compared to prior art. A Au metal layer with a Cr under layer has the worst reflectance as indicated by the lowest curve 1951. Al is substantially better as indicated by curve 1952. Ag is even better as indicated by curve 1953. An Ag metal layer with a thick SiO2 dielectric under layer has generally better reflectance than Ag, although curve 1954 dips below curve 1953 in some places. An Ag metal layer with 2 pairs of DBR followed by with a thick SiO2 has the best reflectance, as indicated by curve 1955.

Figure 15A:
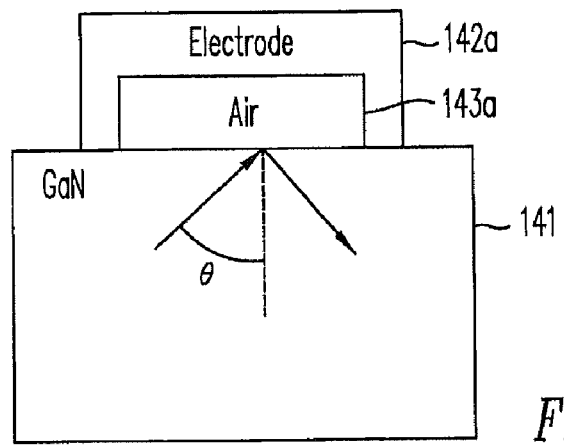
FIG. 15A is a semi-schematic diagram showing a first exemplary embodiment of a suspended electrode according to the present invention.

Referring now to FIG. 15A, a semi-schematic diagram shows a first exemplary embodiment of a suspended electrode according to the present invention. Electrode 142a is suspended above a GaN substrate 141 such that a thick air gap 143a is formed therebetween. Electrode 142a is supported on both sides thereof.

Figure 15B:
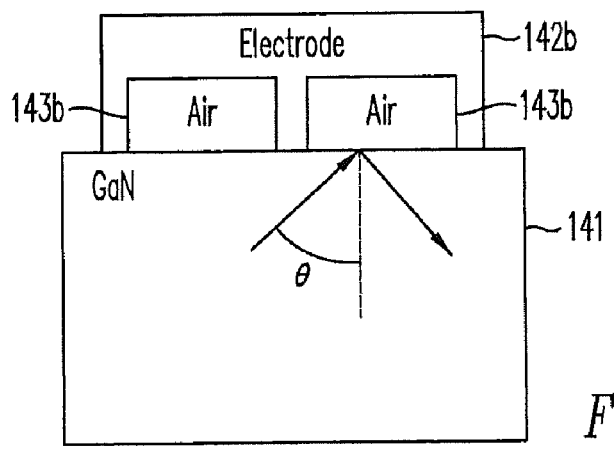
FIG. 15B is a semi-schematic diagram showing a second exemplary embodiment of a suspended electrode according to the present invention.

Referring now to FIG. 15B, a semi-schematic diagram shows a second exemplary embodiment of a suspended electrode according to the present invention. Electrode 142b is suspended above the GaN substrate 141 such that a plurality of air gaps 143b are formed therebetween. Electrode 142a is supported on both sides and in the middle thereof.

Figure 15C:
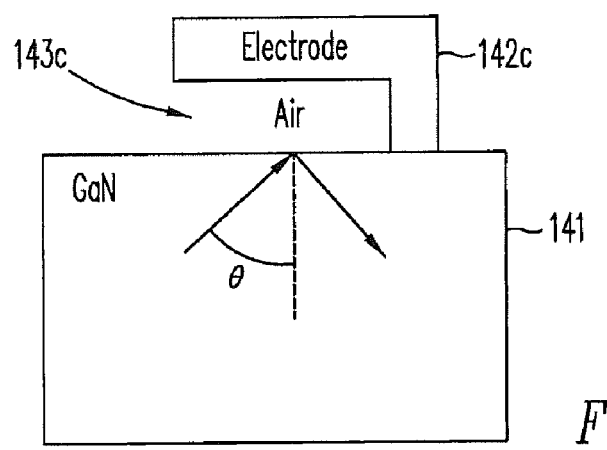
FIG. 15C is a semi-schematic diagram showing a third exemplary embodiment of a suspended electrode according to the present invention.

Referring now to FIG. 15C, a semi-schematic diagram shows a third exemplary embodiment of a suspended electrode according to the present invention. Electrode 142c is suspended above the GaN substrate 141 such that a thick air gap 143c is formed therebetween. Electrode 142c is supported only on one side thereof.

Figure 15D:
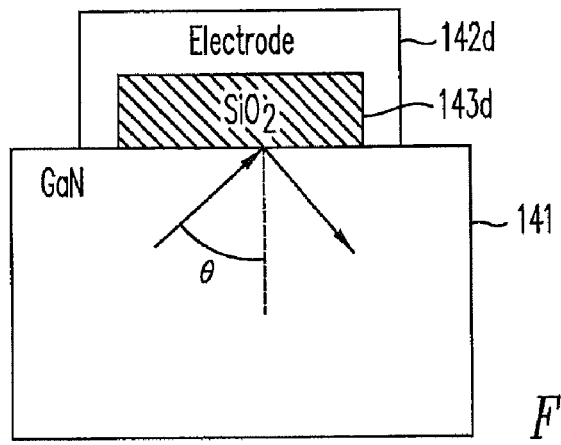
FIG. 15D is a semi-schematic diagram showing a fourth exemplary embodiment of a suspended electrode according to the present invention.

Referring now to FIG. 15D, a semi-schematic diagram shows a fourth exemplary embodiment of a suspended electrode according to the present invention. Electrode 142d is suspended above the GaN substrate 141 and a thick SiO2 layer 143d is formed therebetween. Electrode 142d is supported on both sides thereof.

Figure 15E:
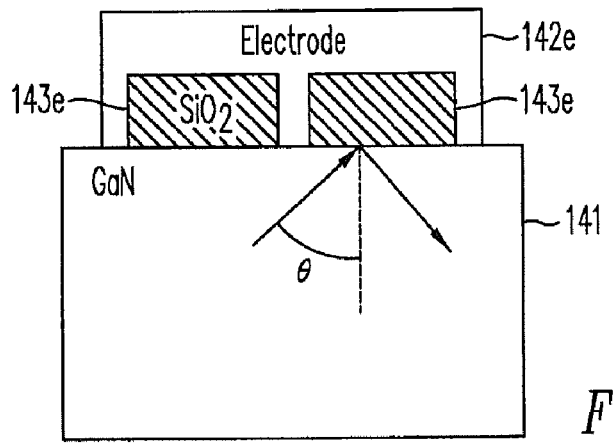
FIG. 15E is a semi-schematic diagram showing a fifth exemplary embodiment of a suspended electrode according to the present invention.

Referring now to FIG. 15E, a semi-schematic diagram shows a fifth exemplary embodiment of a suspended electrode according to the present invention. Electrode 142e is suspended above the GaN substrate 141 and a plurality of sections of a thick SiO2 layer 143e are formed therebetween. Electrode 142e is supported on both sides and in the middle thereof.

Figure 15F:
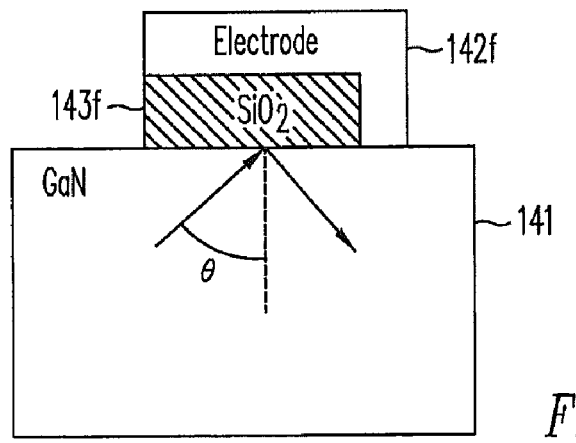
FIG. 15F is a semi-schematic diagram showing a sixth exemplary embodiment of a suspended electrode according to the present invention.

Referring now to FIG. 15F, a semi-schematic diagram shows a sixth exemplary embodiment of a suspended electrode according to the present invention. Electrode 142f is suspended above the GaN substrate 141 such that a thick SiO2 layer 143f is formed therebetween. Electrode 142f is supported only on one side thereof.

Figure 16A:
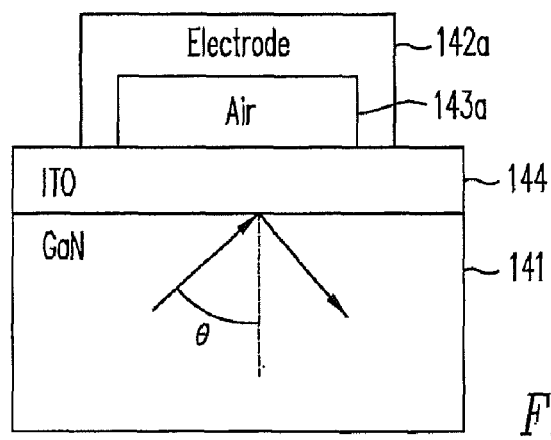
FIG. 16A is a semi-schematic diagram showing a first exemplary embodiment of a suspended electrode with an ohmic contact layer according to the present invention.

Referring now to FIG. 16A, a semi-schematic diagram shows a first exemplary embodiment of a suspended electrode with an ohmic contact layer according to the present invention. The structure of the electrode of FIG. 16A is similar to that of FIG. 15A, except for the addition of indium tin oxide (ITO) layer 144.

Figure 16B:
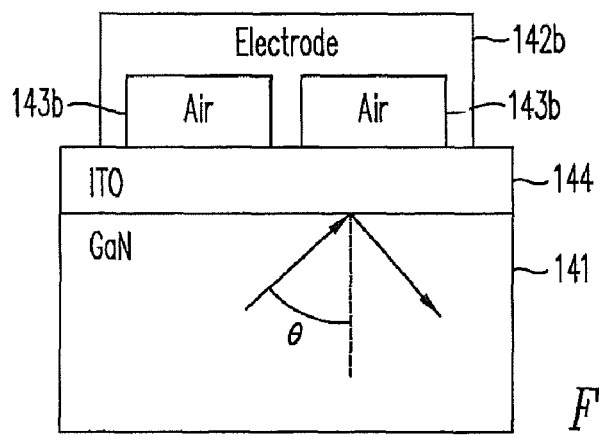
FIG. 16B is a semi-schematic diagram showing a second exemplary embodiment of a suspended electrode with an ohmic contact layer according to the present invention.

Referring now to FIG. 16B, a semi-schematic diagram shows a second exemplary embodiment of a suspended electrode with an ohmic contact layer according to the present invention. The structure of the electrode of FIG. 16B is similar to that of FIG. 16B, except for the addition of indium tin oxide (ITO) layer 144.

Figure 16C:
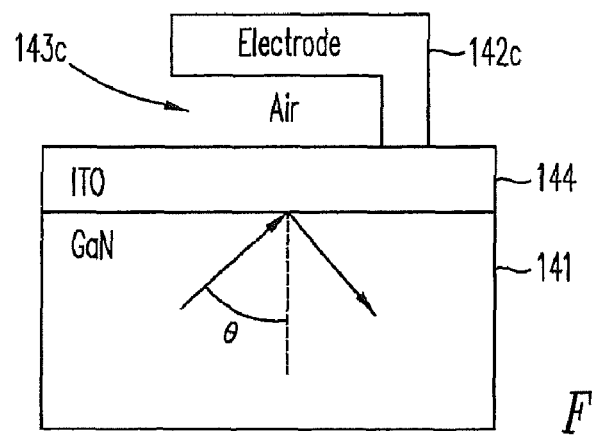
FIG. 16C is a semi-schematic diagram showing a third exemplary embodiment of a suspended electrode with an ohmic contact layer according to the present invention.

Referring now to FIG. 16C, a semi-schematic diagram shows a third exemplary embodiment of a suspended electrode with an ohmic contact layer according to the present invention. The structure of the electrode of FIG. 16C is similar to that of FIG. 15C, except for the addition of indium tin oxide (ITO) layer 144.

Figure 16D:
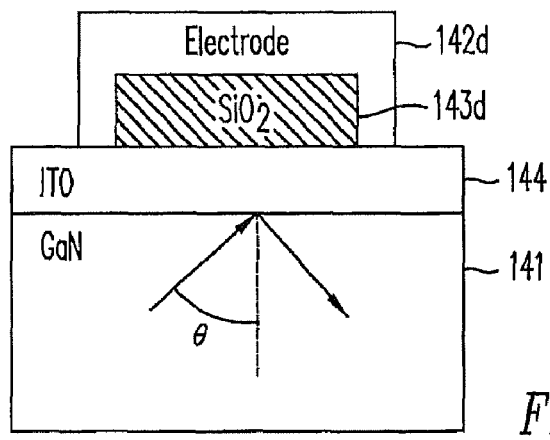
FIG. 16D is a semi-schematic diagram showing a fourth exemplary embodiment of a suspended electrode with an ohmic contact layer according to the present invention.

Referring now to FIG. 16D, a semi-schematic diagram shows a fourth exemplary embodiment of a suspended electrode with an ohmic contact layer according to the present invention. The structure of the electrode of FIG. 16D is similar to that of FIG. 15D, except for the addition of indium tin oxide (ITO) layer 144.

Figure 16E:
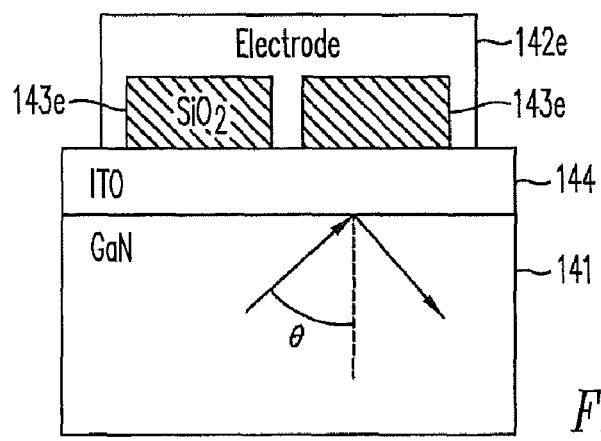
FIG. 16E is a semi-schematic diagram showing a fifth exemplary embodiment of a suspended electrode with an ohmic contact layer according to the present invention.

Referring now to FIG. 16E, a semi-schematic diagram shows a fifth exemplary embodiment of a suspended electrode with an ohmic contact layer according to the present invention. The structure of the electrode of FIG. 16E is similar to that of FIG. 15E, except for the addition of indium tin oxide (ITO) layer 144.

Figure 16F:
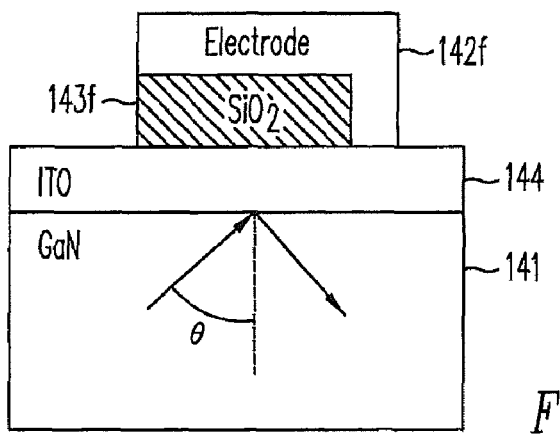
FIG. 16F is a semi-schematic diagram showing a sixth exemplary embodiment of a suspended electrode with an ohmic contact layer according to the present invention.

Referring now to FIG. 16F, a semi-schematic diagram shows a sixth exemplary embodiment of a suspended electrode with an ohmic contact layer according to the present invention. The structure of the electrode of FIG. 15F is similar to that of FIG. 14F, except for the addition of indium tin oxide (ITO) layer 144.

Referring now to FIGS. 17A-17D, an exemplary, contemporary, lateral LED structure and the process for forming it are shown.

Figure 17A:
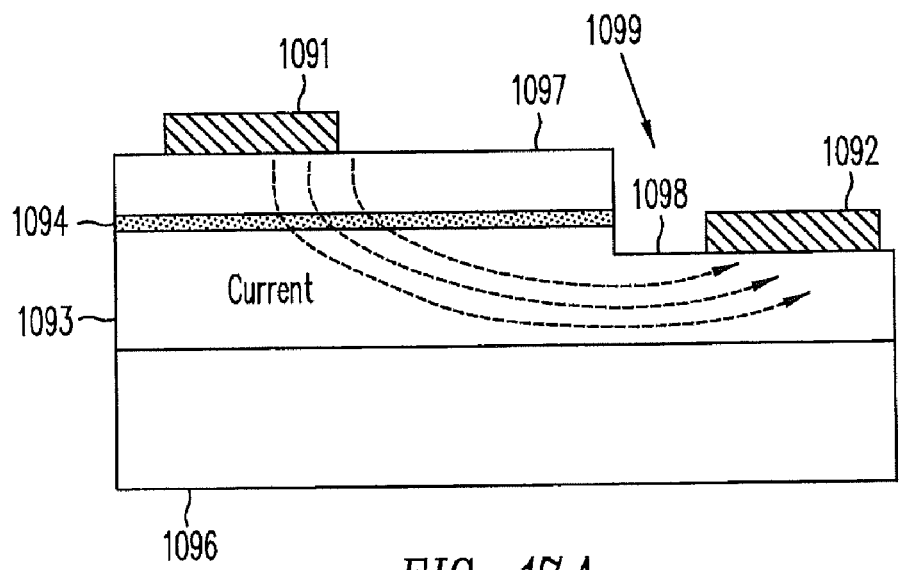
FIG. 17A is cross-section view of a contemporary lateral structure LED.

[With particular reference to FIG. 17A, a pair of wire bond pads 1091 and 1092 facilitate the application of current to a semiconductor 1093. Semiconductor 1093 is formed upon a substrate 1096. Semiconductor 1093 comprises an p-layer 1097 and a n-layer 1098 (n-layer 1098 and p-layer 1097 are generally interchangeable for the purposes of this discussion) The current causes active region 1094 to produce light according to well known principles.

Figure 17B:
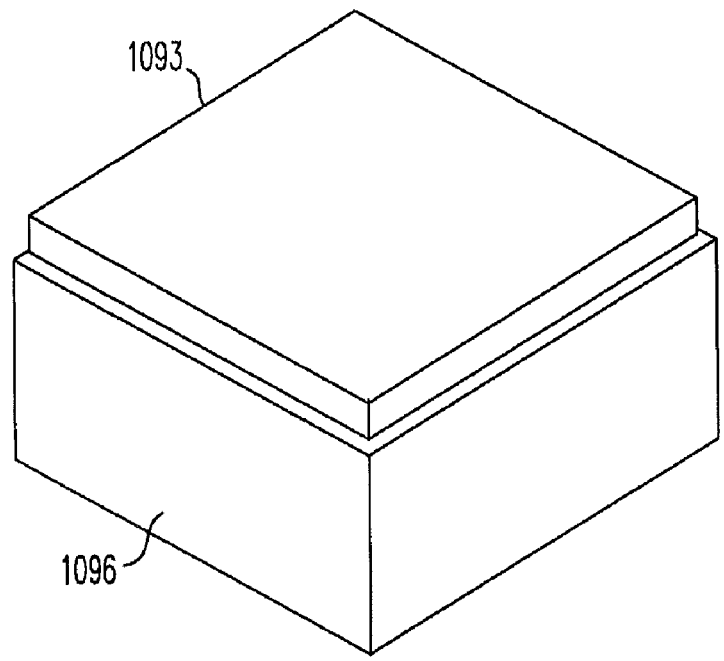
FIGS. 17B-17D are semi-schematic perspective views showing some steps in the process for fabricating the LED of FIG. 17A.

With particular reference to FIG. 17B, the fabrication of the LED of FIG. 9A comprises forming a semiconductor layer 1093 upon a substrate 1096. Semiconductor layer 1093 comprises an n-layer 1098 and a p-layer 1097 (as shown in FIG. 17A).

Figure 17C:
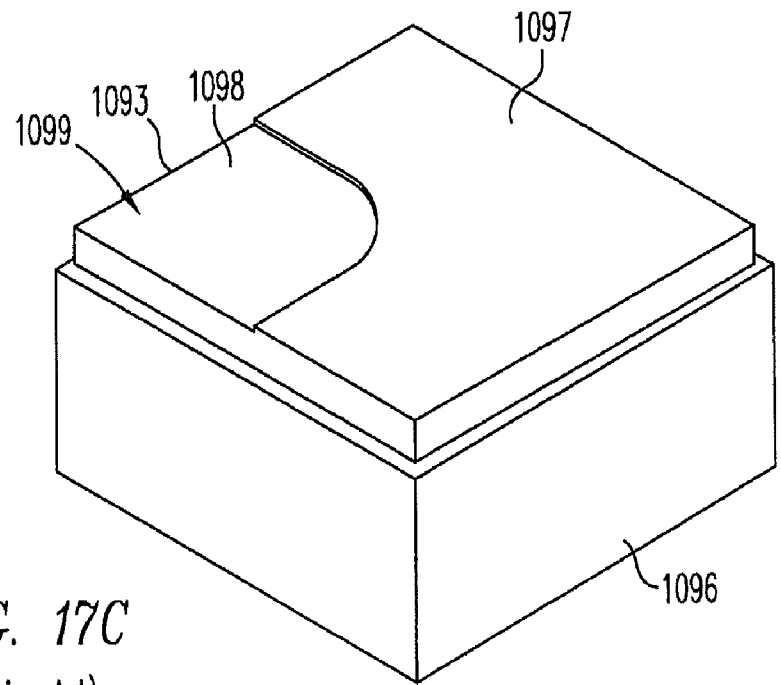

With particular reference to FIG. 17C, a portion of p-layer 1097 is removed, such as by etching. A sufficient amount of p-layer 1097 is removed so as to expose a portion of n-layer 1098 therebeneath. Removal of the portion of p-layer 1097 defines a cutout portion 1099. The formation of cut out 1099 leaves n-layer 1098 exposed.

Figure 17D:
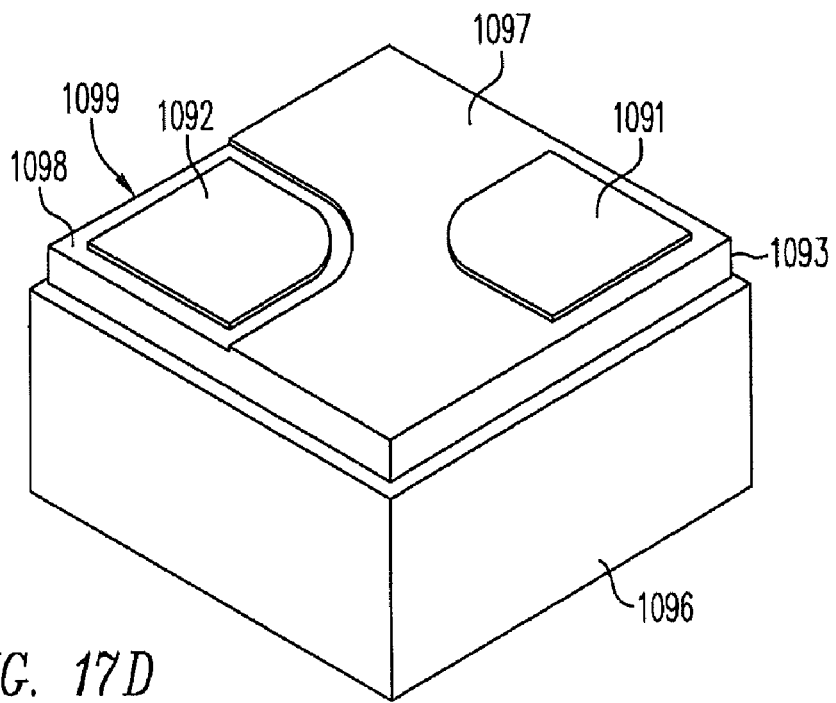

With particular reference to FIG. 17D, wire bond pad 1091 is formed upon p-layer 1097 and wire bond pad 1092 is formed upon n-layer 1098. wire bond pads 1091 and 1092 cover a comparatively large portion of the surface area of semiconductor 1093. For example, the electrode wire bond pads of a contemporary LED can be 100 m×100 m. They thus absorb an undesirably large amount of the light produced by active region 1094. Further, the comparatively large cut out area 1099 that is required for wire bond pads 1092 undesirably reduces the size of active area 1094 and thus further reduces the amount of light produced by such contemporary LEDs. Since the size of each electrode is fixed regardless of device size, the undesirable light absorption can be a significant portion of the overall surface area, particularly for smaller LEDs.

Figure 18A:
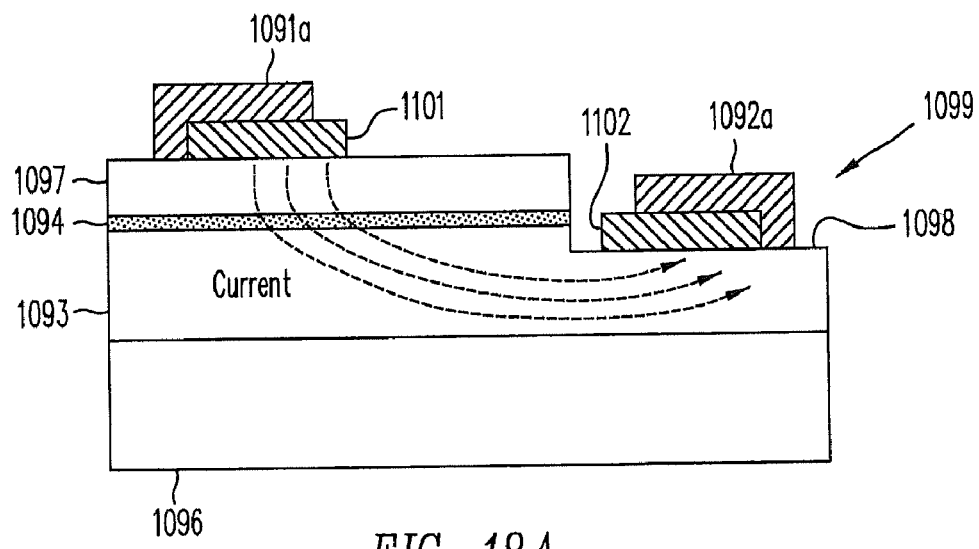
FIG. 18A is cross-section view of a lateral structure LED according to an embodiment of the present invention.

It is worthwhile to appreciate that that the formation of such an electrode structure that is partially within and partially outside of a cutout offers substantial advantage, even if the electrode is not reflective. For example, the electrode structure described in connection with FIGS. 18A-18B below provides adequate bonding area while minimizing the size of the cutout such that less active area is removed and more light can be produced.

Referring now to FIGS. 18A-18E, an exemplary lateral LED structure and the process for forming it according to an embodiment of the present invention are shown. A thick dielectric layer 1101 and 1102 is formed beneath wire bond pads 1091*a* and 1092*a*, respectively. Thick dielectric layers 1101 and 1102 enhance the reflectivity of wire bond pads 1091*a* and 1092*a* such that undesirable light absorption thereby is substantially decreased. A portion of each wire bond pad 1091*a* and 1092*a* remains in contact with semiconductor 1093 so as to facilitate current flow therethrough.

As used herein, a thick dielectric layer is a layer having sufficient thickness such that effects of interference are not substantial. Moreover, as used herein a thick dielectric layer can have a thickness of greater than ¼λ. For example, a thick dielectric layer can have a thickness equal or great then ½λ, approximately 1.5λ, approximately 1.75λ, or greater than 1.75λ.

Figure 18B:
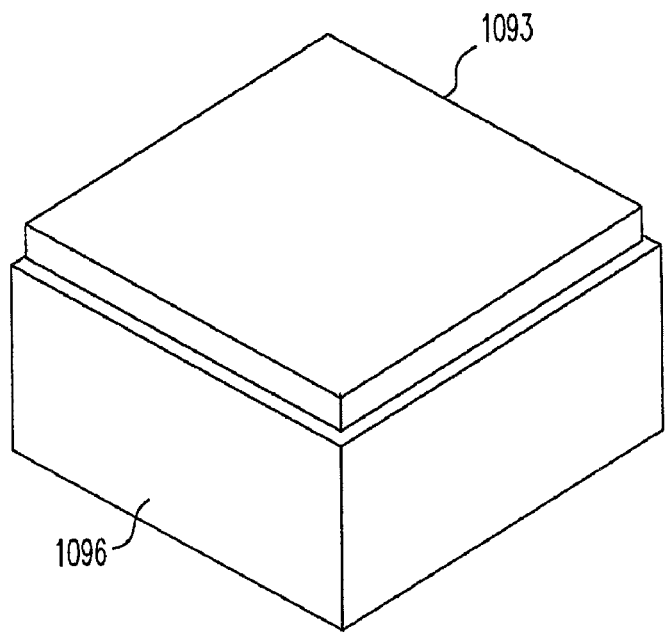
FIGS. 18B-18E are semi-schematic perspective views showing some steps in the process for fabricating the LED of FIG. 18A.
Figure 18C:
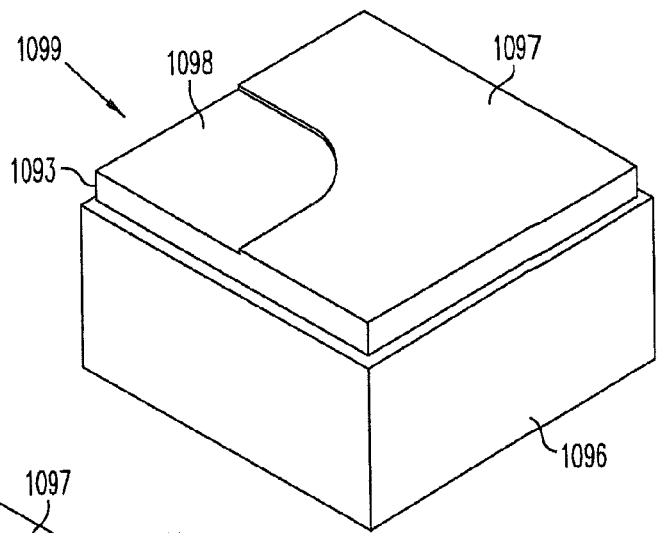

With particular reference to FIGS. 18B and 18C, semiconductor 1093 is formed upon substrate 1096 and cutout 1099 is formed in semiconductor 1093 as in FIGS. 17B and 17C.

Figure 18D:
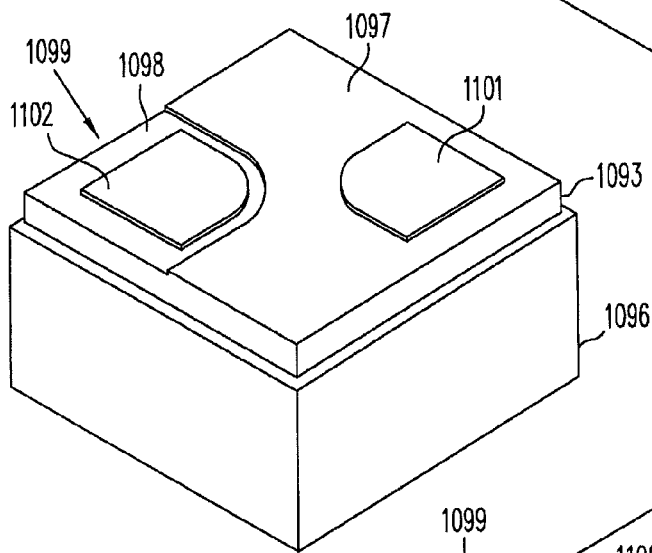

With particular reference to FIG. 18D, thick dielectric layers 1101 and 1102 are formed upon p-layer 1097 and n-layer 1098, respectively. Thick dielectric layers 1101 and 1102 can be formed according to well known principles.

Figure 18E:
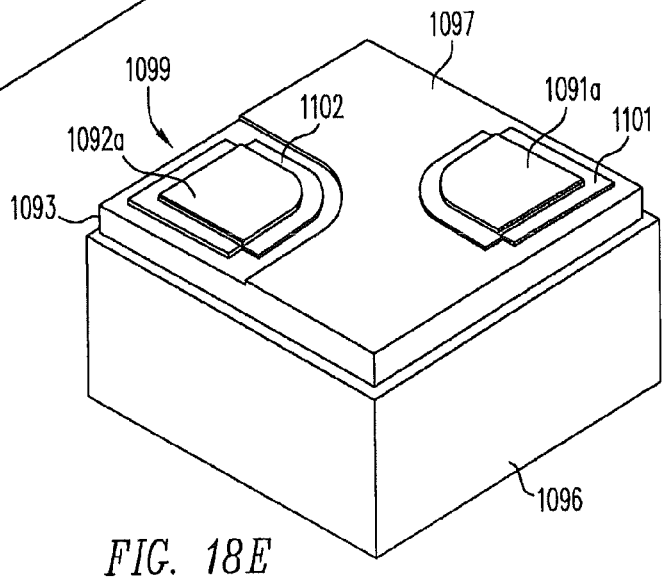

With particular reference to FIG. 18E, wire bond pad 1091*a* is formed so as to at least partially cover thick dielectric layer 1101 and wire bond pad 1092*a* is formed so as to at least partially cover thick dielectric layer 1102. As mentioned above, a portion of wire bond pads 1091*a* and 1092*a* contacts semiconductor 1093 therebeneath.

Referring now to FIG. 19A-19E an exemplary lateral LED structure and the process for forming it according to an embodiment of the present invention are shown.

Figure 19A:
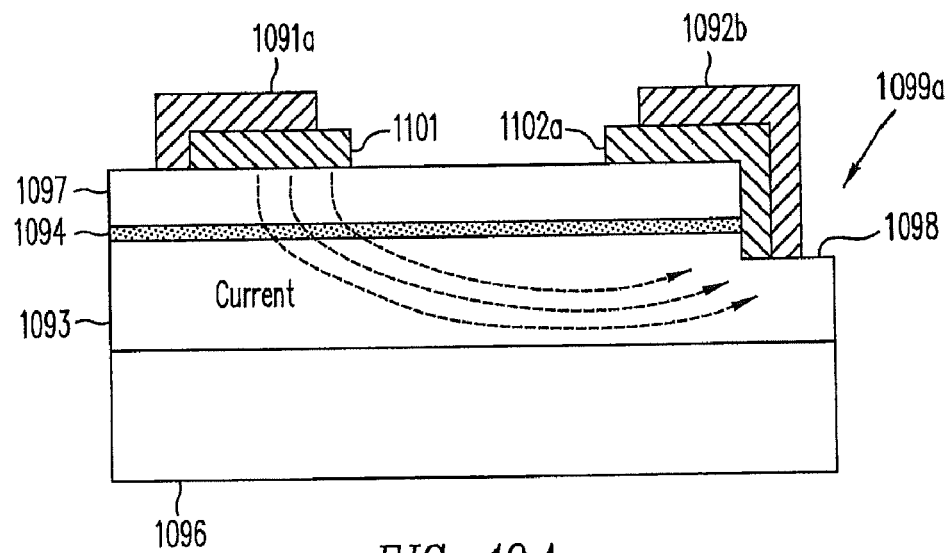
FIG. 19A is cross-section view of a lateral structure LED according to an embodiment of the present invention.

With particular reference to FIG. 19A A thick dielectric layer 1101 and 1102*a* is formed beneath wire bond pads 1091*a* and 1092*b*, respectively. Thick dielectric layers 1101 and 1102*a* enhance the reflectivity wire bond pads 1091*a* and 1092*b* such that undesirable light absorption thereby is substantially decreased. A portion of each wire bond pad 1091*a* and 1092*b* remains in contact with semiconductor 1093 so as to facilitate current flow.

Figure 19B:
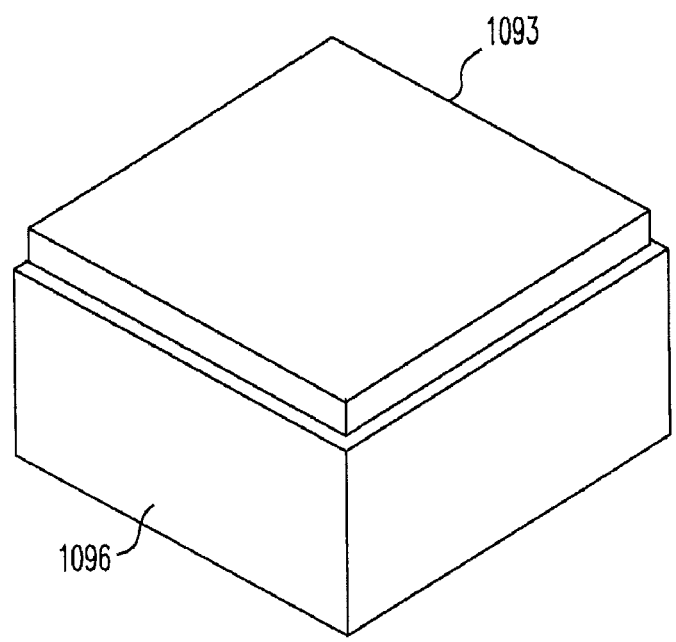
FIGS. 19B-19E are semi-schematic perspective views showing some steps in the process for fabricating the LED of FIG. 19A.
Figure 19C:
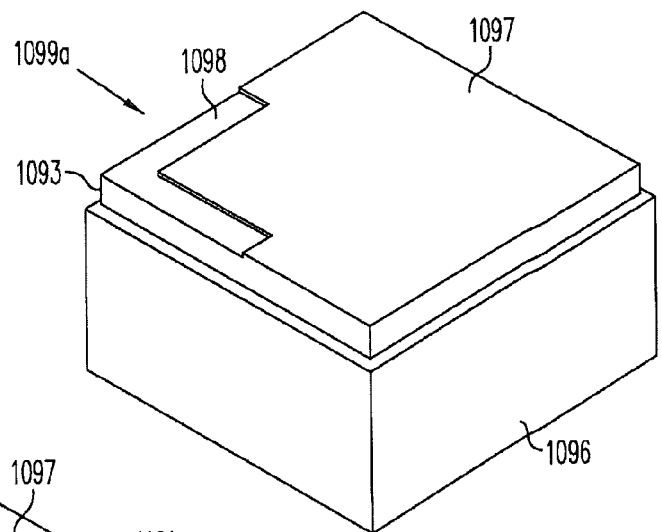

With particular reference to FIGS. 19B and 19C, semiconductor 1093 is formed upon substrate 1096 and cutout 1099*a* is formed in semiconductor 1093 as in FIGS. 17B and 17C. However, in this embodiment cutout 1099*a* is formed in an L-shaped configuration so as to mitigate the amount of surface area thereof. In this manner, less of the active area is sacrificed in the formation of cutout 1099*a* and the brightness of the LED is consequently enhanced.

Figure 19D:
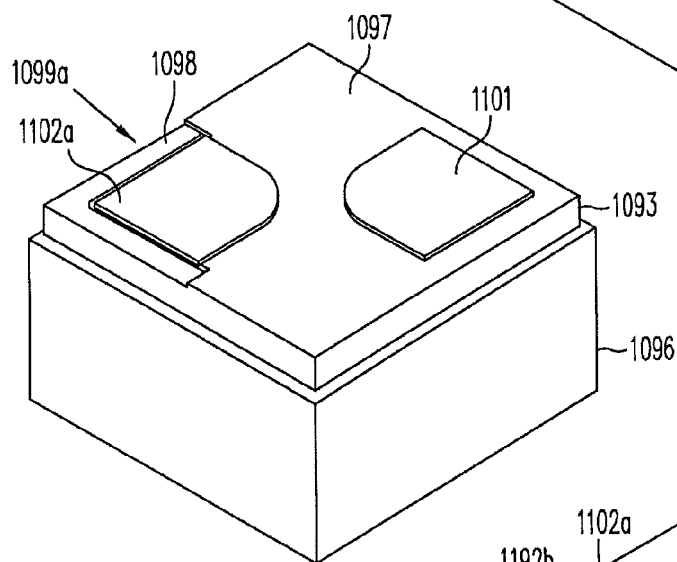

With particular reference to FIG. 19D, a thick dielectric layer 1101 is formed upon the p-layer 1097. Another thick dielectric layer 1102*a* is formed partially on the p-layer 1097 and partially on the n-layer 1098. Thick dielectric layers 1101 and 1102*a* can again be formed according to well known principles. In this instance thick dielectric layer 1102*a* is formed downwardly, along the side of p-layer 1097 and active layer 1094 so as to electrically insulate wire bond pad 1092*b* therefrom. That is, thick dielectric layer 1102*a* is formed upon both p-layer 1097 and n-layer 1098, as well as the interface therebetween, i.e., active layer 1094. Thick dielectric layer 1102*a* stair steps downwardly from n-layer 1097 to n-layer 1098. This configuration of thick dielectric layer 1102*a* is best seen in the cross section of FIG. 19A.

Figure 19E:
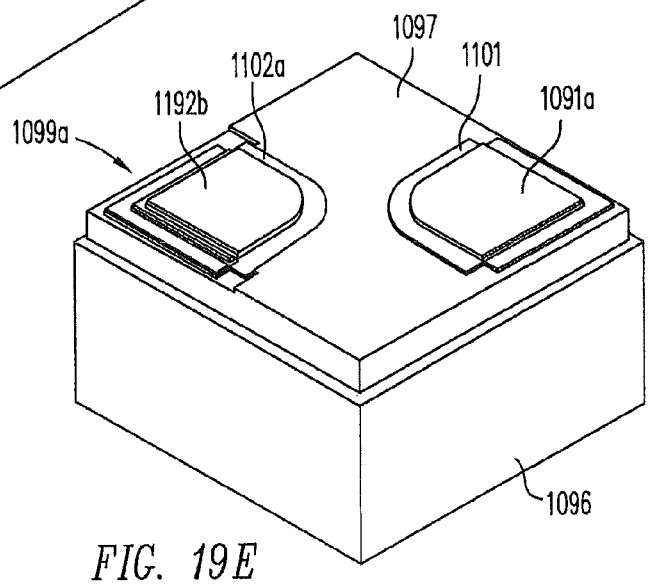

With particular reference to FIG. 19E, wire bond pad 1091*a* is formed so as to at least partially cover thick dielectric layer 1101 and wire bond pad 1092*b* is formed so as to at least partially cover thick dielectric layer 1102*a*. As mentioned above, a portion of wire bond pad 1091*a* contacts p-layer 1097 and a portion of wire bond pad 1092*b* contacts n-layer 1098. In this instance, wire bond pad 1092*b* is formed downwardly, insulated by and covering thick dielectric layer 1102*a* and electrically contacting n-layer 1098. The configuration of wire bond pad 1092*b* is best seen in FIG. 19A.

In this embodiment, thick dielectric layers 1101 and 1102*a* substantially mitigate light absorption by wire bond pads 1091*a* and 1092*b* so as to enhance the brightness of the LED. The reduced size of cutout 1099*a* provides a larger active area 1094, so as to further enhance the brightness of the LED.

According to the present invention, a thick dielectric can be formed between at least a portion of each bond pad and/or electrode and the semiconductor material. The thick dielectric material enhances reflectivity such that undesirable light absorption by the bond pad and/or electrode is substantially mitigated.

Figure 20A:
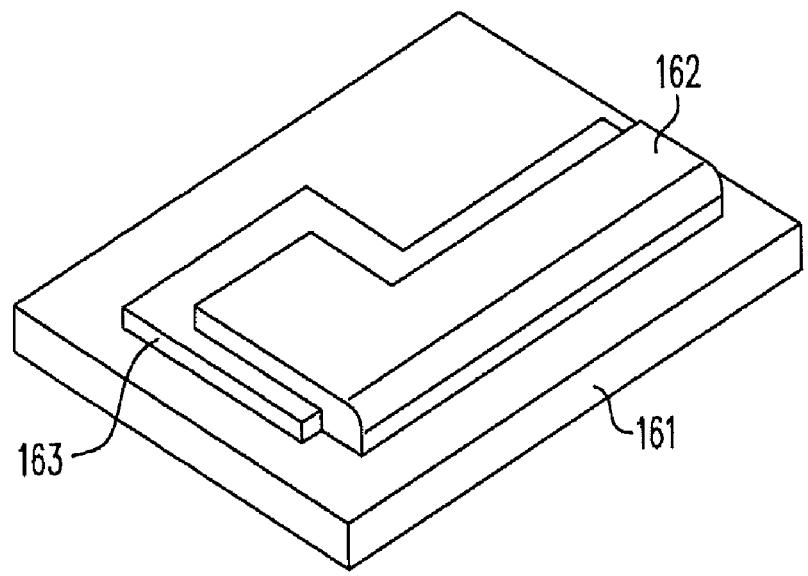
FIG. 20A is a semi-schematic perspective view showing another embodiment of suspended structure according to an embodiment of the present invention.

Referring now to FIG. 20A, a semi-schematic perspective view shows one embodiment of a suspended electrode structure according to an embodiment of the present invention. A metal electrode 162 is formed upon a semiconductor 161. A thick dielectric 163 is formed between metal electrode 162 and semiconductor 161. A portion of electrode 162 is formed over thick dielectric 163 and a portion of electrode 162 contacts semiconductor 161 such that electrode 162 is in electrical contact with semiconductor 161.

Figure 20B:
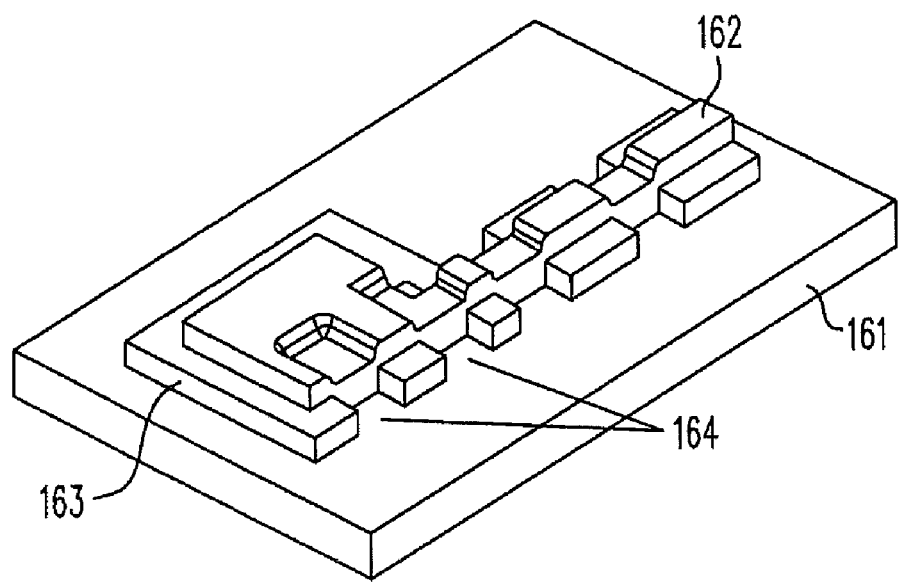
FIG. 20B is a semi-schematic perspective view showing another embodiment of suspended structure according to an embodiment of the present invention.

Referring now to FIG. 20B, a semi-schematic perspective view shows another configuration of a suspended electrode structure according to an embodiment of the present invention. This structure is generally similar to that of FIG. 20A except that thick dielectric 163 is broken up such that portions of electrode 162 contact semiconductor is different places than in FIG. 20A. As shown in FIG. 20B, multiple contacts of electrode 162 to semiconductor 161 are provided. As those skilled in the art will appreciate, various configurations of electrode 162 and thick dielectric 163, with electrode 162 contacting semiconductor 161 in various different places, are possible.

FIGS. 21A-24 show exemplary electrode structures that utilize thick dielectrics according to one or more embodiments of the present invention. For example, one or more layers of insulating dielectric can be formed under the bonds pads. Some advantages of such construction include: the mitigation of current crowding, thus facilitating a simplified design; the minimization of light absorption because the dielectric layer(s) under the electrode can form a mirror; more efficient use of the emission area that is achieved by reducing the cutout area; a more easily scalable design for a large range of die sizes; comparatively low forward voltage; and more even current spreading.

The exemplary embodiments of FIGS. 21A-24 are implementations of an elongated chip. Such elongated chips can provide enhanced brightness with better efficiency.

Figure 21A:
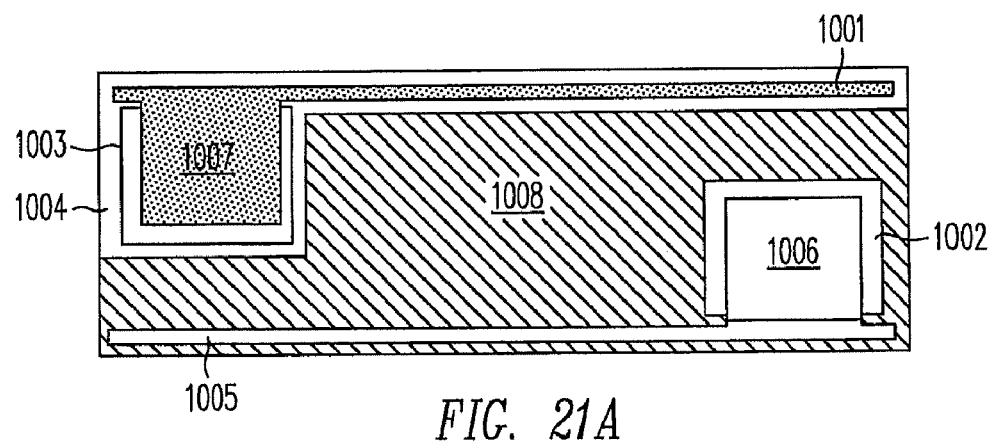
FIG. 21A is a semi-schematic diagram showing an exemplary embodiment of the present invention in an elongated LED.

Referring now to FIG. 21A, an electrode design for an elongated chip is shown. Thick dielectric layers 1002 and 1003 can be formed under each of the bond pads 1006 (the p-bond pad, for example) and 1007 (the n-bond pad, for example). N-bond pad 1007 and n-electrode extension 1001 are formed upon an etched away portion of semiconductor material 1008 or cutout 1004

The thick dielectric layers 1002 and 1003 insulate the bond pads 1006 and 1007 from semiconductor material 1008 so as to mitigate current crowding. This results in an improved geometry for more even current flow. Hot spots that cause uneven brightness and can result in damage to the LED are substantially mitigated.

Such thick dielectric layers are not formed under conductive extensions 1001 and 1005 that define n-wiring and p-wiring respectively. Extensions 1001 and 1005 thus more evenly distribute current throughout semiconductor 1008. That is, the distance between the electrodes that provide current to the LED tends to be more equal according to one aspect of the present invention.

It is worthwhile to appreciate that total internal reflection (TIR) provides a substantial advantage in enhancing light extraction for one or more embodiments of the present invention. The use of a DBR structure is optional and can be used, according to at least one embodiment of the present invention, to further enhance light extraction.

The use of TIR and/or DBR structures as described above can substantially mitigate undesirable absorption of light under bond pads 1006 and 1007. Such insulators (as well as insulating layers 1002 ands 1003) can be formed beneath bond pads 1006 and 1007 and not beneath extensions 1001 and 1005, so that current flow through semiconductor (and consequently the active region thereof) is more evenly distributed.

Figure 21B:
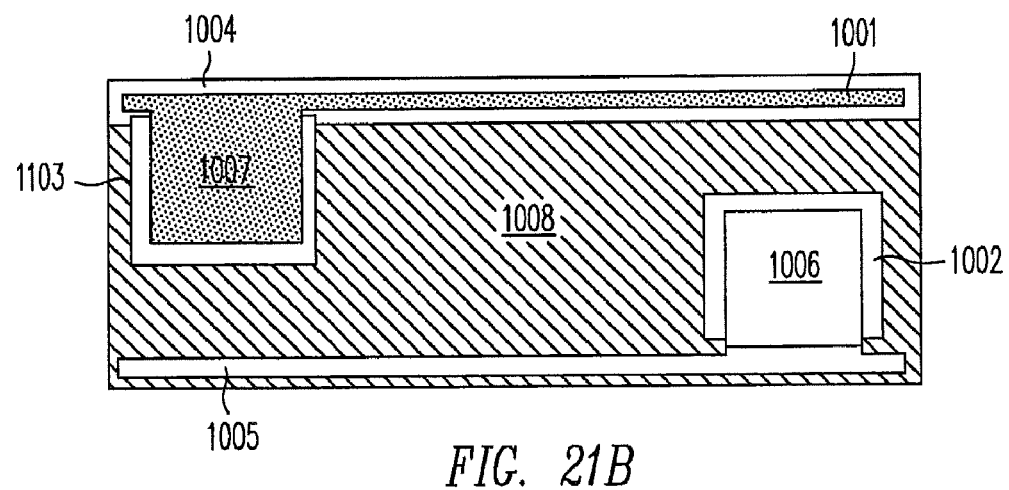
FIG. 21B is a semi-schematic diagram showing an exemplary embodiment of the present invention in an elongated LED.

Bond pads 1006 and 1007, as shown in FIGS. 21A and 21B, are not located exactly at the end of the wire traces or extensions 1001 and 1005. This is to show that bond pads 1006 and 1007 can be placed at any arbitrary location along the trace. Thus, bond pads 1006 and 1007 can be placed at the end, near the end, and/or in the middle of extensions 1001 and 1005. Any desired location of bond pads 1006 and 1007 can be used.

Referring now to FIG. 21B, a potential improvement with respect to the configuration of FIG. 21A is shown. The area of cutout 1104 is reduced by putting the n-bond pad above the p-surface and separated form the p-surface by the thick dielectric. That is, at least a portion of the n-bond pad is not in cutout 1104 and cutout 1104 can thus be much smaller than in FIG. 21A. This thick dielectric must also cover the edges of the cutout to ensure isolation of the n-bond pad from the p-Layer. That is, the area of the cutout is reduced such that the size of the active area is increased. The larger emission area facilitated by using a smaller cutout 1004 can enable a greater power output.

In some applications, the distance between the p and n electrodes may be too great, thus resulting in an undesirably high forward voltage. In such cases, the use of multiple electrodes may be beneficial. FIGS. 22A-23C show various exemplary implementations of three electrode designs that can mitigate such undesirability high forward voltages.

Figure 22A:
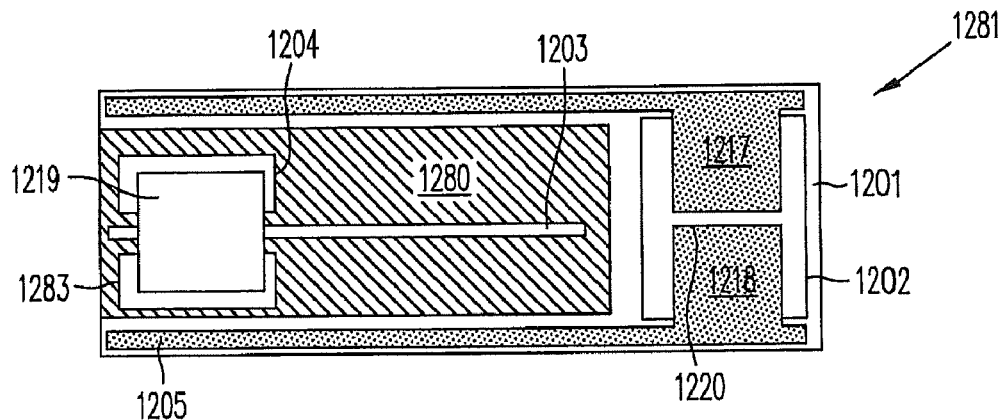
FIG. 22A is a semi-schematic diagram showing an exemplary embodiment of the present invention in an elongated LED.
Figure 22B:
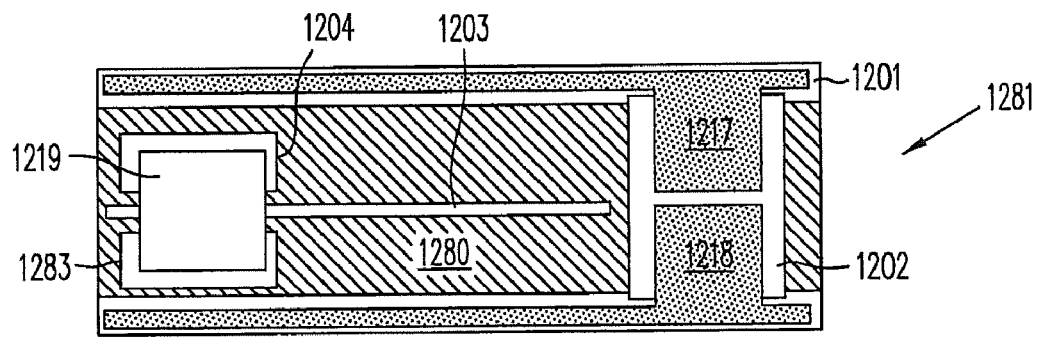
FIG. 22B is a semi-schematic diagram showing an exemplary embodiment of the present invention in an elongated LED.
Figure 22C:
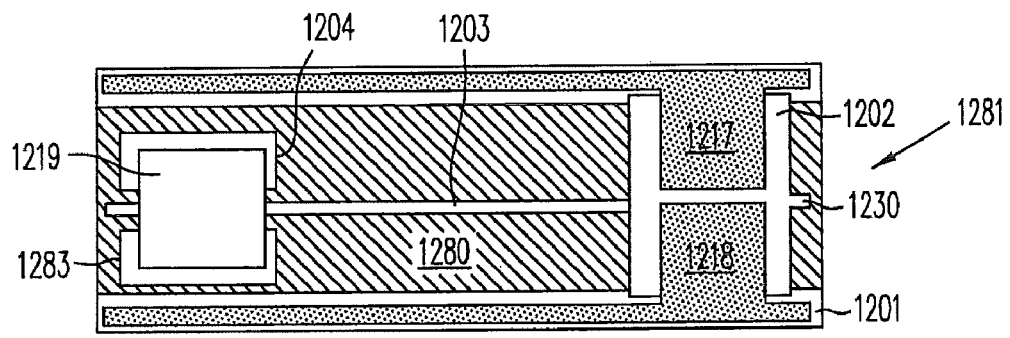
FIG. 22C is a semi-schematic diagram showing an exemplary embodiment of the present invention in an elongated LED.

Referring now to FIGS. 22A-22C, the n-bond pad is shown split into two electrically isolated pads 1217 and 1218. In principle, they can be touching (and thus in electrical contact with one another) and thus effectively form a single pad. There can be two separate wire bonds, one to each of pads 1217 and 1218. However if a gap 1220 between pad 1217 and 1218 is small enough, then a single bond pad can be used to electrically connect bond pads 1217 and 1218 together. In this manner, any desired number of such electrodes can be used.

With particular reference to FIG. 22A, two n-bond pads 1217 and 1218 and a single p-bond pad 1219 can be used. Two thick dielectric layers 1204 and 1283 can be formed between each bond pad 1219 and the semiconductor material 1280 disposed therebeneath. Similarly, a thick dielectric layer 1202 can be formed between bond pads 1217 and 1218 and the semiconductor material 1201 of cutout 1281. As mentioned above, such construction results in more even current distribution. This is particularly true for larger and/or higher current LEDs.

With particular reference to FIG. 22B, the area of cutout 1201 is reduced with respect to that shown in FIG. 22A in a manner analogous to that of FIG. 21B. Again, two thick dielectric layers 1204 and 1283 can be formed between each bond pad 1219 and the semiconductor material 1280 disposed therebeneath. Similarly, a thick dielectric layer 1202 can be formed between bond pads 1217 and 1218 and the semiconductor material 1201 of cutout 1281.

With particular reference to FIG. 22C, p-wiring extension 1203 extends beneath n-bond pad thick dielectric 1202 such that a distal end 1230 of p-wiring extension extends to the right of thick dielectric 1202. Again, two thick dielectric layers 1204 and 1283 can be formed between each bond pad 1219 and the semiconductor material 1280 disposed therebeneath. Similarly, a thick dielectric layer 1202 can be formed between bond pads 1217 and 1218 and the semiconductor material 1201 of cutout 1281.

Figure 23A:
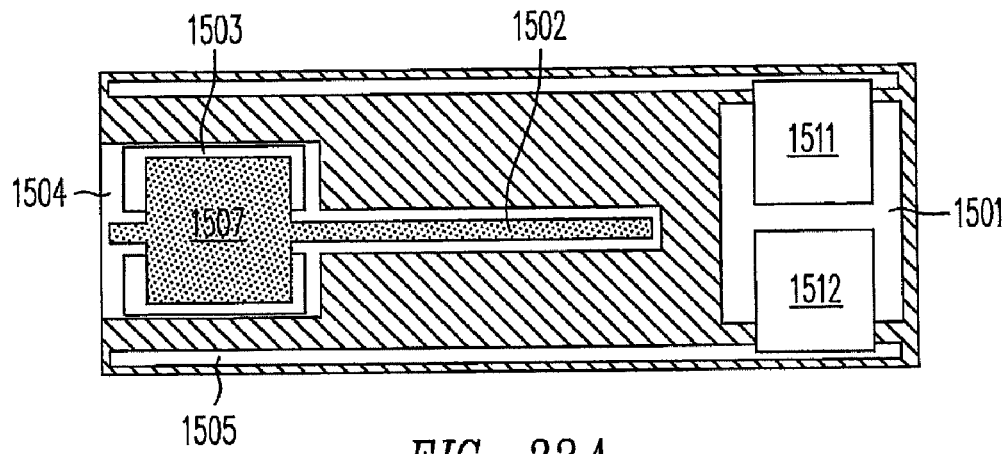
FIG. 23A is a semi-schematic diagram showing an exemplary embodiment of the present invention in an elongated LED.
Figure 23B:
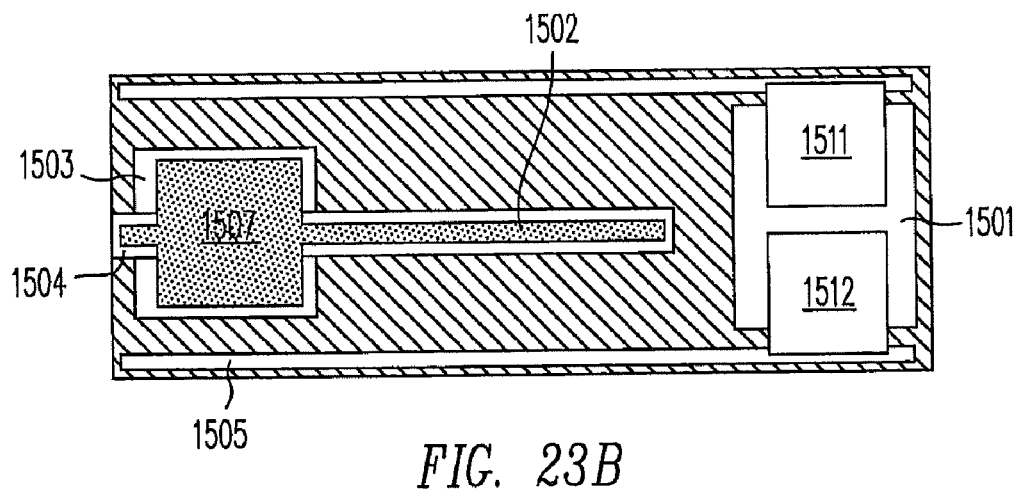
FIG. 23B is a semi-schematic diagram showing an exemplary embodiment of the present invention in an elongated LED.
Figure 23C:
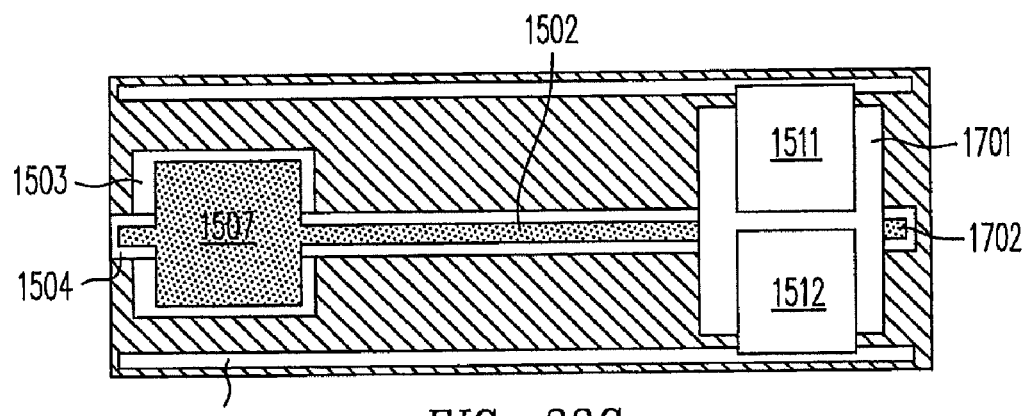
FIG. 23C is a semi-schematic diagram showing an exemplary embodiment of the present invention in an elongated LED.

With particular reference to FIG. 23A-23C, the p-layer and the n-layer are reversed in position (with a consequent reversal in the respective bond pads, insulators, etc) to show that the construction of FIGS. 22A-22C is suitable with either type of device. Thus, n-bond 1507 and thick n-bond pad dielectric 1503 are formed on cutout 1504 and p-bond pads 1511 and 1512 and thick p-bond pad dielectric 1501 are not formed on cutout 1504 (which is the opposite of the construction shown in FIGS. 22A-22C). Thus, the electrodes are reversed with respect to those shown in FIGS. 22A-22C.

Figure 24:
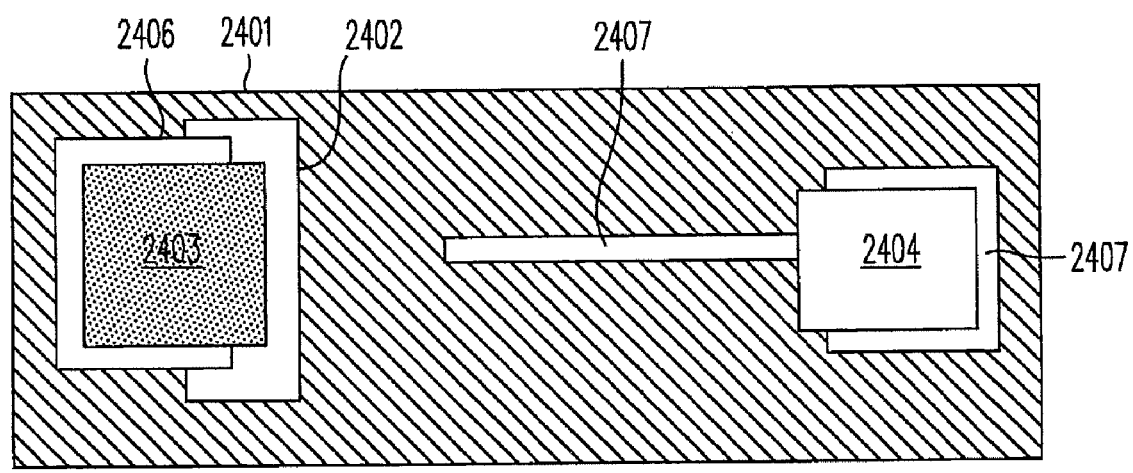
FIG. 24 is a semi-schematic diagram showing an exemplary embodiment of the present invention in an elongated LED.

With particular reference to FIG. 24, a two electrode LED that facilitates more uniform current distribution is shown. An n-bond pad 2403 and a p-bond pad 2404 are formed upon a semiconductor material 2401. n-bond pad 2403 has a thick dielectric layer 2406 form between itself and semiconductor material 2401. Similarly, p-bond pad 2404 has a thick dielectric layer 2407 formed between itself and semiconductor material 2401.

A cutout 2402 facilitates contact of n-bond pad 2403 to the n-layer of semiconductor 2401. A portion of n-bond pad 2403 can be formed outside of cutout 2402 (and thus upon the p-layer of semiconductor material 2401) and a portion of n-bond pad 2403 can be formed within cutout 2402 (to provide electrical contact with the n-layer). Similarly, a portion of thick dielectric layer 2406 can be formed outside of cutout 2402 (and thus upon the p-layer of semiconductor material 2401) and a portion of thick dielectric layer 2406 can be formed within cutout 2402.

n-bond pad 2403 and thick dielectric layer 2406 thus extend down the side of cutout 2402 from the n-layer to the p-layer of semiconductor material 2401, in a fashion similar to that of FIG. 21B. Such construction tends to minimize the size of cutout 2402 and thus tends to enhance the brightness and efficiency of the LED, as discussed above.

p-wiring or extension 2407 extends from p-pad 2404 so as to more uniformly distribute current through the active region of semiconductor 2401. A portion of p-pad 2404 and all of extension 2407 can be formed directly upon semiconductor material 2401 (without a thick dielectric layer therebetween).

Although in FIGS. 15-24 only a single thick dielectric layer is shown, a series of one or more DBR pairs can be deposed between the thick dielectric and the electrode. Similarly, although FIGS. 15-24 show the electrode in direct contact with the semiconductor material, the contact can be via an ohmic contact layer or current spreading layer.

According to one or more embodiments of the present invention, the thick dielectric can be non-perforated. That is, the dielectric can be continuous in cross-section. It can be formed such that it does not have any holes or perforations that would cause the thick dielectric to appear to be discontinuous in cross-section.

The dielectric material can be porous. Thus, thick dielectric materials which may otherwise be too dense (and thus have to high of an index of refraction) can be used by effectively reducing the density (and the effective index of refraction, as well) by making the dielectric material porous or non continuous.

In view of the foregoing, one or more embodiments of the present invention provide a brighter and/or more efficient LED. Increasing the brightness of an LED enhances its utility by making it better suited for use in a wide of applications. For example, brighter LEDs can be suitable for general illumination applications. Further, more efficient LEDs are desirable because they tend to reduce the cost of use (such as by reducing the amount of electricity required in order to provide a desire amount of light.

Embodiments described above illustrate, but do not limit, the invention. It should also be understood that numerous modifications and variations are possible in accordance with the principles of the present invention. Accordingly, the scope of the invention is defined only by the following claims.

What is claimed:

1. A light emitting diode chip, comprising:
a semiconductor material capable of emitting light from a planar surface responsive to application of a potential across a first metallic wire bonding pad structure disposed on the planar surface and ohmicly coupled with an p-doped region of the semiconductor material, and a second metallic wire bonding pad structure ohmicly coupled with a n-doped region of the semiconductor material, and
wherein at least the first metallic bonding pad structure is ohmicly coupled with the p-doped region of the semiconductor material by a current spreading layer disposed on the planar surface that contacts both the first metallic bonding pad structure and the p-doped region of the semiconductor material, and wherein the first metallic bonding pad structure is separated physically from the semiconductor material by a non-perforated layer of dielectric material disposed on the p-doped region of the semiconductor material.

2. The light emitting diode chip of claim 1, wherein the first metallic wire bonding pad structure comprises a reflective layer facing the layer of dielectric material and the semiconductor material.

3. The light emitting diode chip of claim 1, wherein the layer of dielectric material is formed to have a thickness of at least one half of a wavelength of light emitted by the semiconductor material.

4. The light emitting diode chip of claim 1, wherein the layer of dielectric material is formed to have a thickness of at least one wavelength of light emitted by the semiconductor material.

5. The light emitting diode chip of claim 1, wherein the layer of dielectric material is formed to have a thickness of at least one and a half wavelengths of light emitted by the semiconductor material.

6. The light emitting diode chip of claim 1, wherein the layer of dielectric material is formed to have a thickness of at least one and three quarter wavelengths of light emitted by the semiconductor material.

7. The light emitting diode chip of claim 1, wherein the semiconductor material is supported by a transparent non-conductive substrate, and further comprising a cutout portion of the semiconductor material exposing a surface of the n-doped region, wherein the second metallic wire bonding pad structure ohmicly couples with the exposed surface of the n-doped region, and extends to the p-doped region, where the second metallic wire bonding pad structure is separated physically from the n-doped region by a second layer of dielectric material.

8. The light emitting diode chip of claim 7, wherein the substrate comprises sapphire.

9. A light emitting diode chip, comprising:
a semiconductor material in which is formed a diode junction, the diode junction capable of emitting light from a planar surface of the semiconductor material, responsive to application of a potential across a first metallic bond pad structure and a second metallic bond pad structure, wherein
one or more of the first metallic bond pad structure and the second metallic bond pad structure is separated from the semiconductor material by an optically transmissive non-perforated region of insulating material having an index of refraction greater than or equal to one and less than that of the semiconductor material and is supported from the planar surface, and
electrical continuity between one or more of the first metallic bond pad structure and the second metallic bond pad structure is provided by one or more optically transmissive conducting layers in ohmic contact with both the semiconductor material and respectively one or more of the first metallic bond pad structure and the second metallic bond pad structure.

10. The light emitting diode chip of claim 9, wherein the optically transmissive insulating material comprises porous silicon dioxide, and has a lower index of refraction than non-porous silicon dioxide.

11. The light emitting diode chip of claim 9, wherein the optically transmissive insulating material has a thickness of at least one half of a wavelength of light emitted by the LED device.

12. The light emitting diode chip of claim 9, wherein the insulating material has a thickness of about between ½ and 1¾ wavelengths of light emitted by the LED device in the optically transmissive insulating material.

13. The light emitting diode chip of claim 9, wherein the first metallic bond pad structure and the second metallic bond pad structure respectively comprise a layer of Rhenium disposed between the optically transmissive insulating material and a metallic bonding region comprising Au.

14. The light emitting diode chip of claim 9, wherein the optically transmissive dielectric material comprises porous Indium Tin Oxide.

* * * * *